United States Patent
Fujimoto

(10) Patent No.: US 9,876,418 B2
(45) Date of Patent: Jan. 23, 2018

(54) ACTUATOR

(71) Applicant: PIONEER CORPORATION, Kanagawa (JP)

(72) Inventor: Kenjiro Fujimoto, Kanagawa (JP)

(73) Assignee: PIONEER CORPORATION, Kanagawa (JP)

( * ) Notice: Subject to any disclaimer, the term of this patent is extended or adjusted under 35 U.S.C. 154(b) by 355 days.

(21) Appl. No.: 14/766,456

(22) PCT Filed: Feb. 8, 2013

(86) PCT No.: PCT/JP2013/053111
§ 371 (c)(1),
(2) Date: Aug. 7, 2015

(87) PCT Pub. No.: WO2014/122781
PCT Pub. Date: Aug. 14, 2014

(65) Prior Publication Data
US 2016/0006330 A1 Jan. 7, 2016

(51) Int. Cl.
*H02K 33/00* (2006.01)
*G02B 26/08* (2006.01)
*G02B 26/10* (2006.01)
*B81B 3/00* (2006.01)
*H02K 33/18* (2006.01)

(52) U.S. Cl.
CPC .............. *H02K 33/00* (2013.01); *B81B 3/007* (2013.01); *G02B 26/085* (2013.01); *G02B 26/101* (2013.01); *H02K 33/18* (2013.01); *B81B 2203/0109* (2013.01)

(58) Field of Classification Search
CPC ........ H02K 33/00; H02K 33/18; B81B 3/007; G02B 26/101
See application file for complete search history.

(56) References Cited

U.S. PATENT DOCUMENTS 5,579,148 A * 11/1996 Nishikawa ........... G02B 26/101
    235/462.36
5,999,303 A * 12/1999 Drake .................. G02B 7/1821
    359/223.1
6,201,629 B1 * 3/2001 McClelland ....... G02B 26/0841
    359/223.1

(Continued)

FOREIGN PATENT DOCUMENTS

| JP | 2003-172897 | 6/2003 |
| JP | 2004-325578 | 11/2004 |

(Continued)

OTHER PUBLICATIONS

International Search Report PCT/JP2013/053111 dated Apr. 23, 2013.

*Primary Examiner* — Robert W Horn
(74) *Attorney, Agent, or Firm* — Young & Thompson

(57) ABSTRACT

An actuator (1) has a movable portion (120); a supporting portion (210, 110); and a torsion bar (230), a rib (123) is formed on a surface of the movable portion, the movable portion has a protruding portion (122) which protrudes in a direction along the surface and protrudes toward an outside of the movable portion, at least one portion of the rib is formed on the surface to extend on the protruding portion.

16 Claims, 16 Drawing Sheets

(56) References Cited

U.S. PATENT DOCUMENTS

| | | | | |
|---|---|---|---|---|
| 6,803,938 | B2* | 10/2004 | Turner | B41J 2/471 347/237 |
| 6,956,684 | B2* | 10/2005 | Orcutt | B81B 3/007 310/36 |
| 7,072,089 | B2* | 7/2006 | Turner | B81B 3/007 359/224.1 |
| 7,224,507 | B2* | 5/2007 | Kamiya | G02B 26/0833 359/200.7 |
| 7,256,926 | B2* | 8/2007 | Kamiya | G02B 26/0833 359/224.1 |
| 7,259,900 | B2* | 8/2007 | Orcutt | B81B 3/007 359/200.7 |
| 7,408,690 | B2* | 8/2008 | Mizoguchi | G02B 26/085 310/36 |
| 7,417,779 | B2* | 8/2008 | Orcutt | B81B 3/007 359/198.1 |
| 7,485,485 | B2* | 2/2009 | Linden | G02B 26/0833 257/E21.002 |
| 7,515,329 | B2* | 4/2009 | Sprague | G02B 26/085 359/292 |
| 7,567,367 | B2* | 7/2009 | Ji | B81B 3/007 359/198.1 |
| 7,573,628 | B2* | 8/2009 | Cho | G02B 26/085 359/202.1 |
| 7,636,101 | B2* | 12/2009 | Sprague | B41J 2/471 347/243 |
| 7,684,102 | B2* | 3/2010 | Watanabe | G02B 26/085 359/224.1 |
| 7,710,627 | B2* | 5/2010 | Yoon | G02B 26/085 359/224.1 |
| 7,855,819 | B2* | 12/2010 | Kato | G02B 26/0866 359/212.1 |
| 7,864,392 | B2* | 1/2011 | Ueyama | G02B 26/0858 359/199.1 |
| 7,880,571 | B2* | 2/2011 | Ko | G02B 26/085 335/78 |
| 8,094,352 | B2* | 1/2012 | Orcutt | B29D 11/00596 359/199.3 |
| 8,553,305 | B2* | 10/2013 | Nakamura | G02B 26/085 359/200.7 |
| 8,570,633 | B2* | 10/2013 | Jeong | G02B 26/085 359/224.1 |
| 8,717,652 | B2* | 5/2014 | Takahashi | B81B 3/004 359/198.1 |
| 9,467,034 | B2* | 10/2016 | Gamet | B81B 3/0072 |
| 9,588,337 | B2* | 3/2017 | Van Lierop | G02B 26/0841 |
| 9,681,015 | B2* | 6/2017 | Mizoguchi | H04N 1/036 |
| 2007/0146857 | A1 | 6/2007 | Orcutt et al. | |
| 2007/0268543 | A1 | 11/2007 | Cho et al. | |
| 2008/0018974 | A1* | 1/2008 | Cho | G02B 26/085 359/224.1 |
| 2009/0109512 | A1* | 4/2009 | Park | G02B 26/0833 359/199.2 |
| 2012/0162739 | A1 | 6/2012 | Yamada | |
| 2013/0264663 | A1* | 10/2013 | Dehe | H04R 19/005 257/416 |
| 2015/0203346 | A1* | 7/2015 | Fujimoto | G02B 26/085 74/1 SS |
| 2016/0006330 | A1* | 1/2016 | Fujimoto | B81B 3/007 310/38 |

FOREIGN PATENT DOCUMENTS

| | | |
|---|---|---|
| JP | 2005-308820 | 11/2005 |
| JP | 2007-310342 | 11/2007 |
| JP | 2010-054944 | 3/2010 |
| JP | 2010-128116 | 6/2010 |
| JP | 2012-133242 | 7/2012 |

* cited by examiner

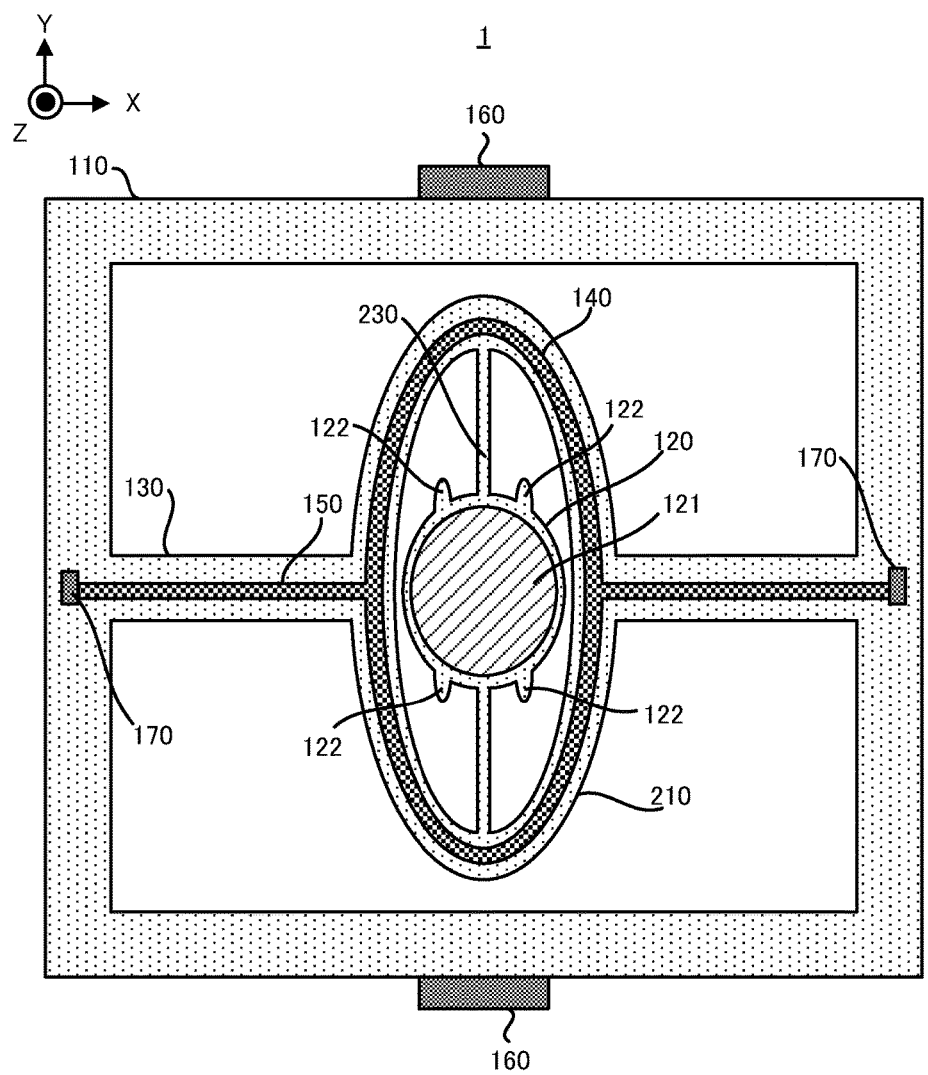
[FIG. 1]

[FIG. 2]
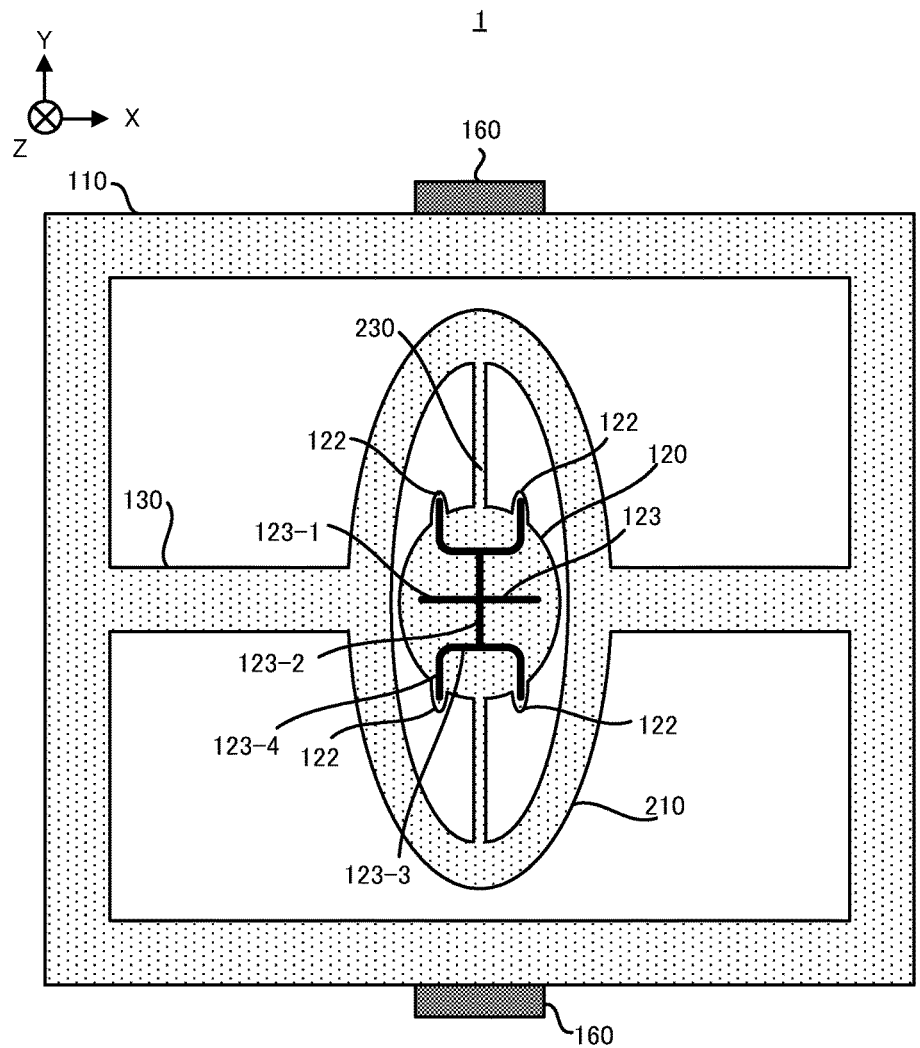
(a)
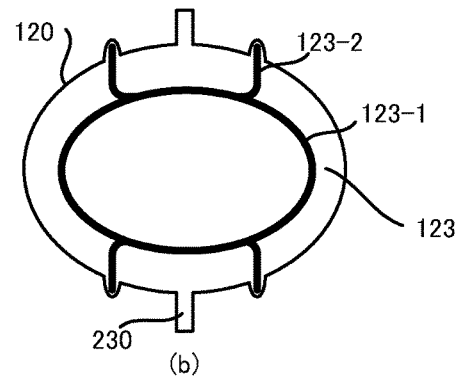
(b)

[FIG. 3]
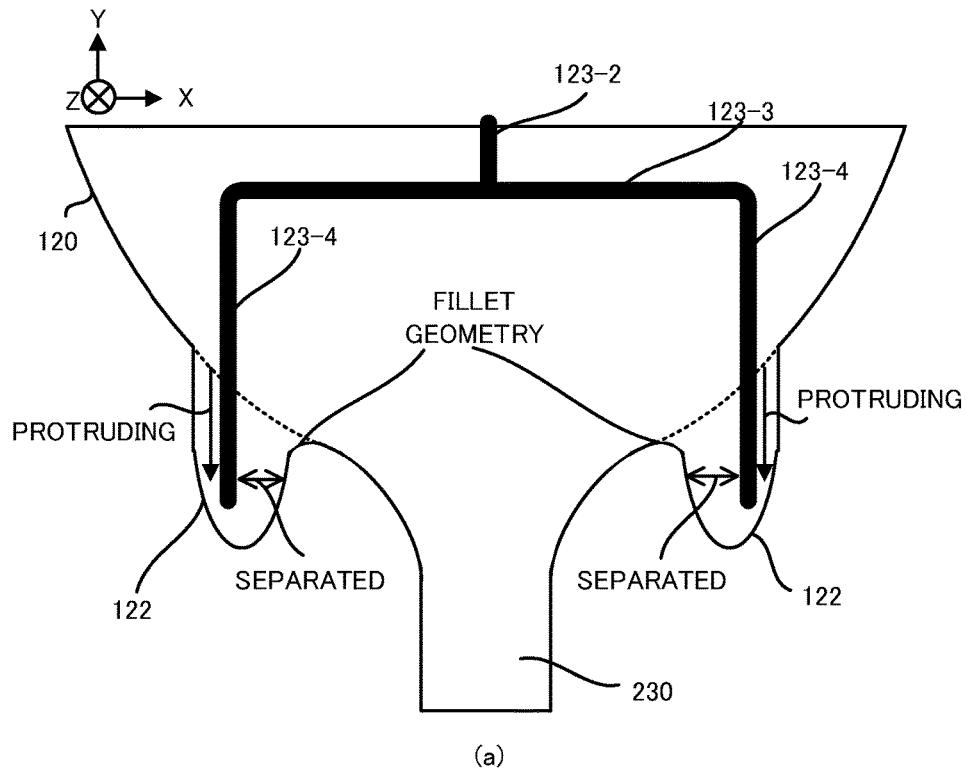
(a)
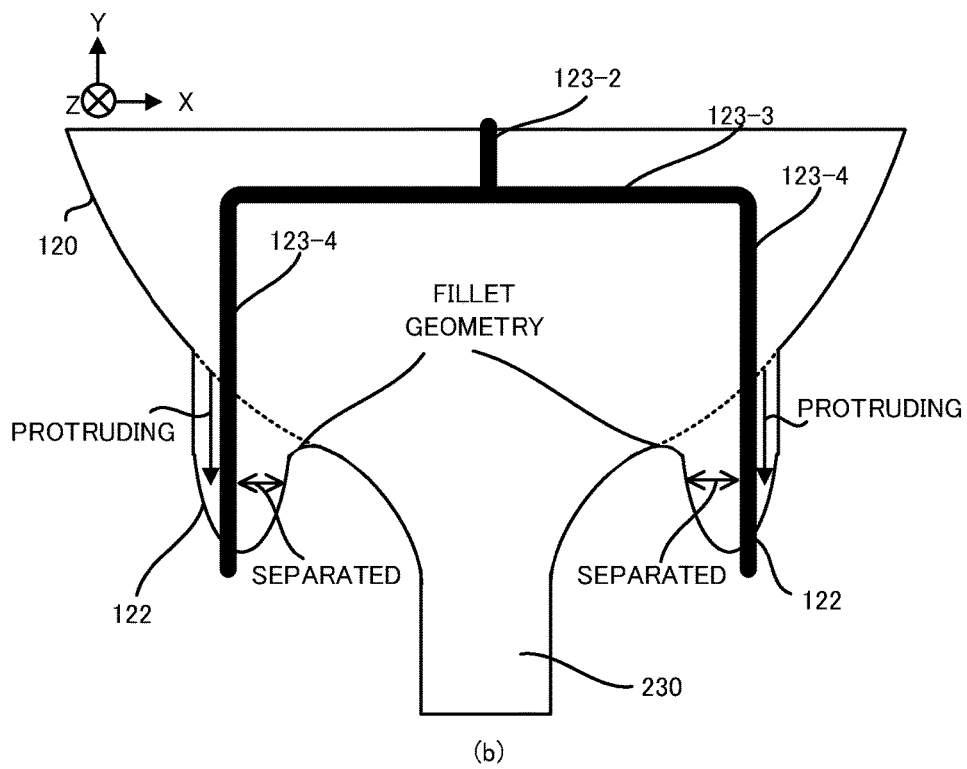
(b)

[FIG. 4]
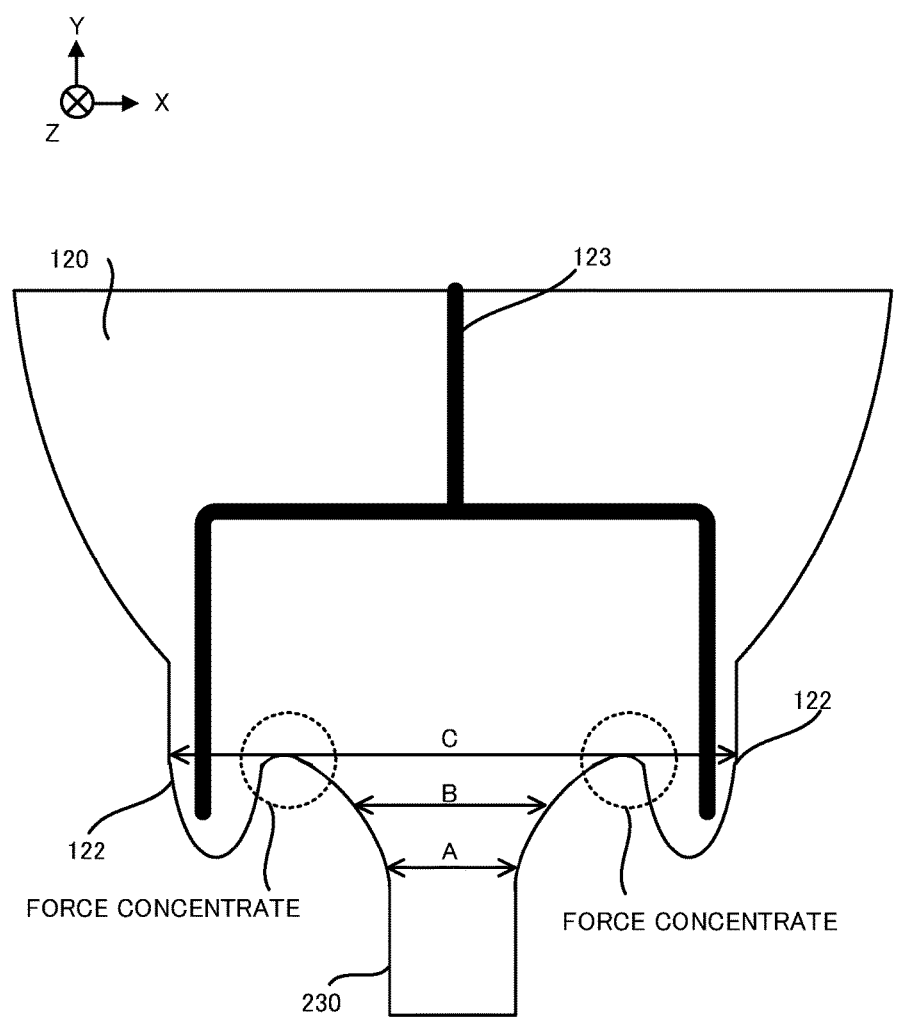

[FIG. 5]
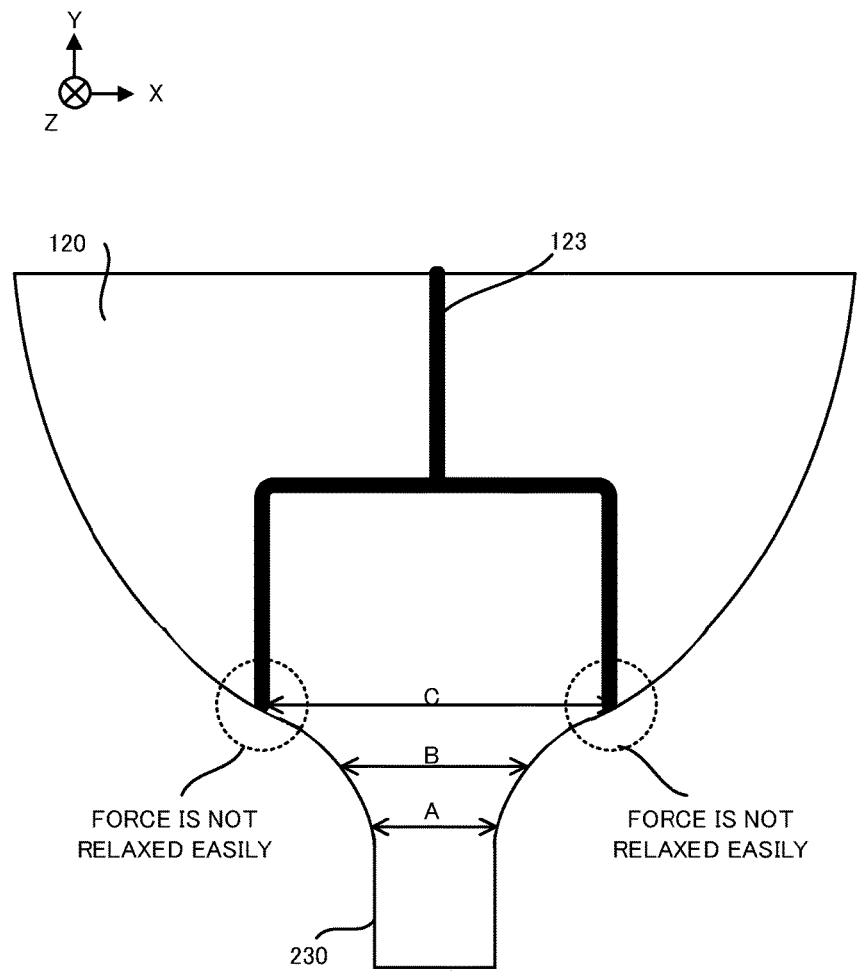

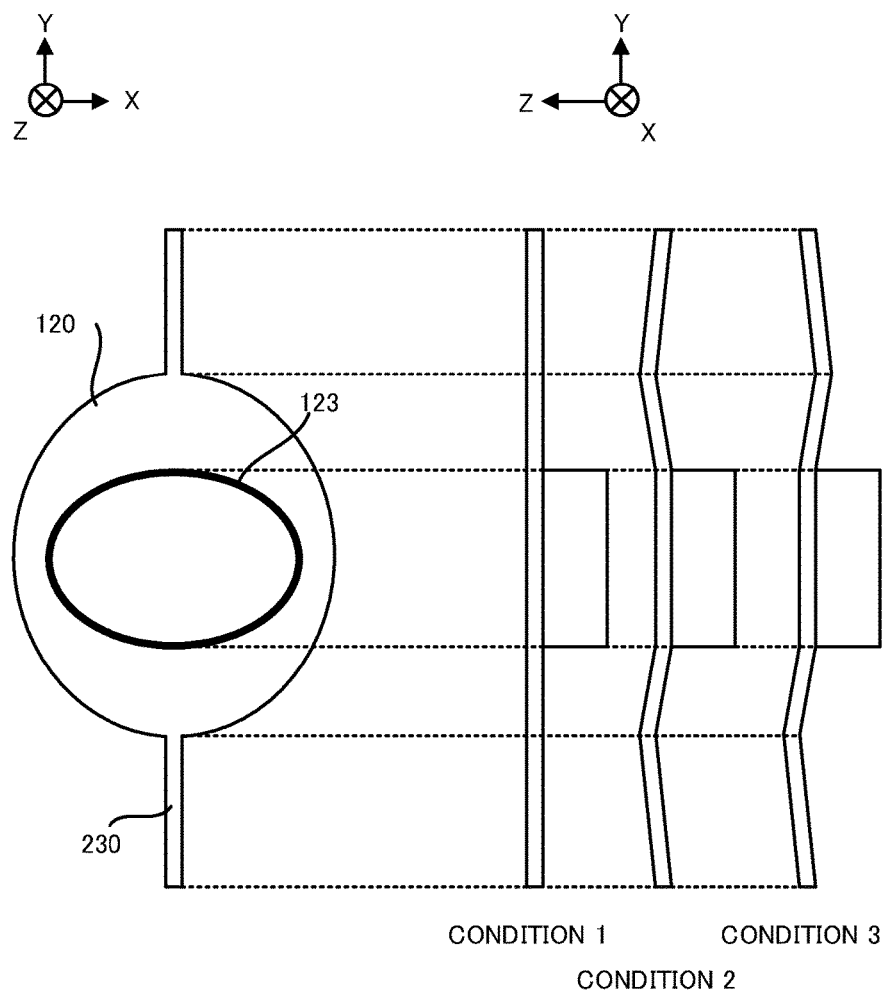

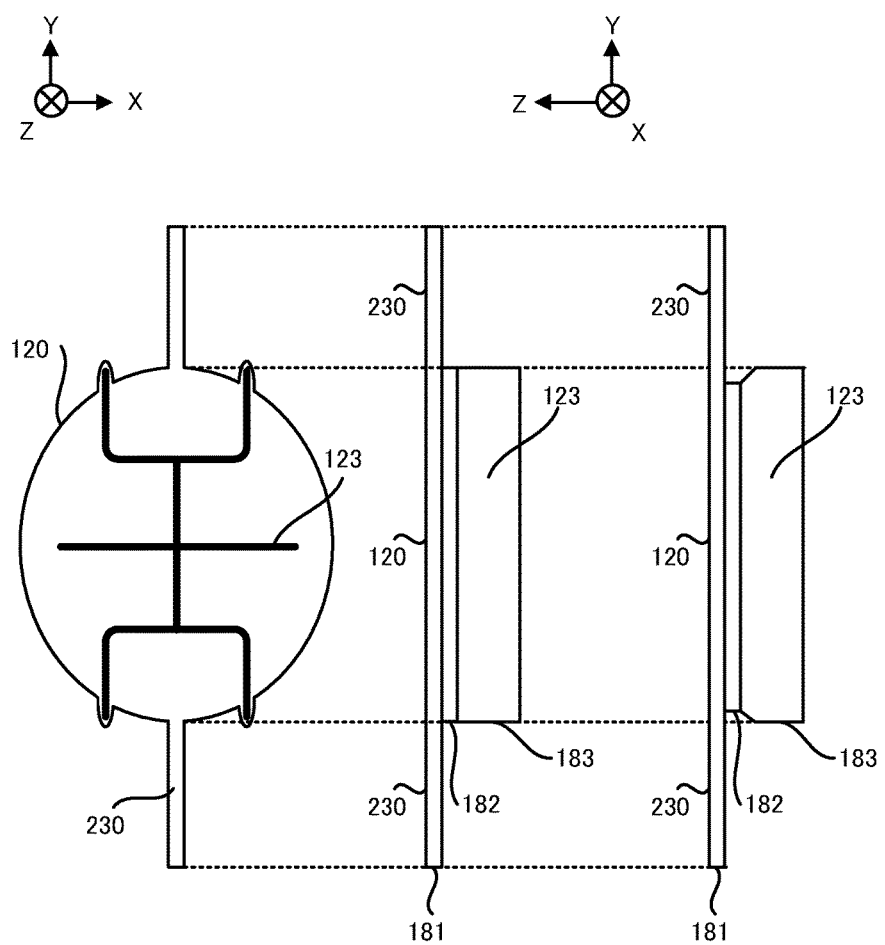
[FIG. 7]

[FIG. 8]
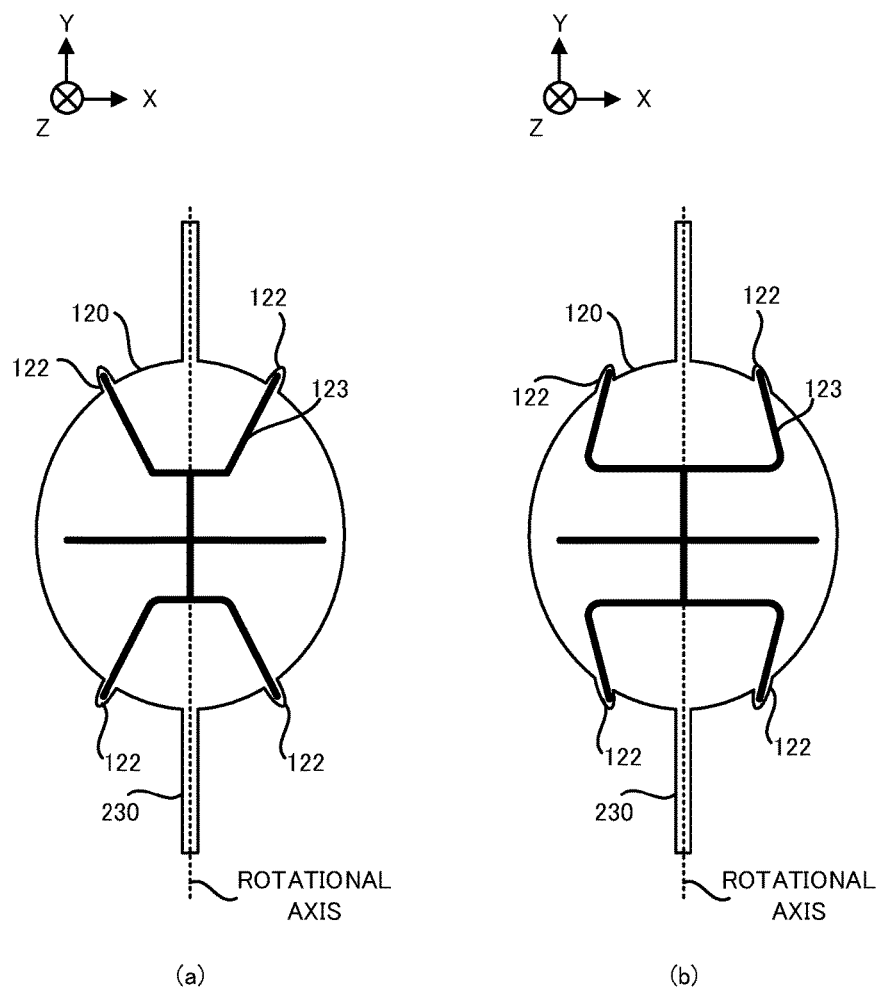

[FIG. 9]
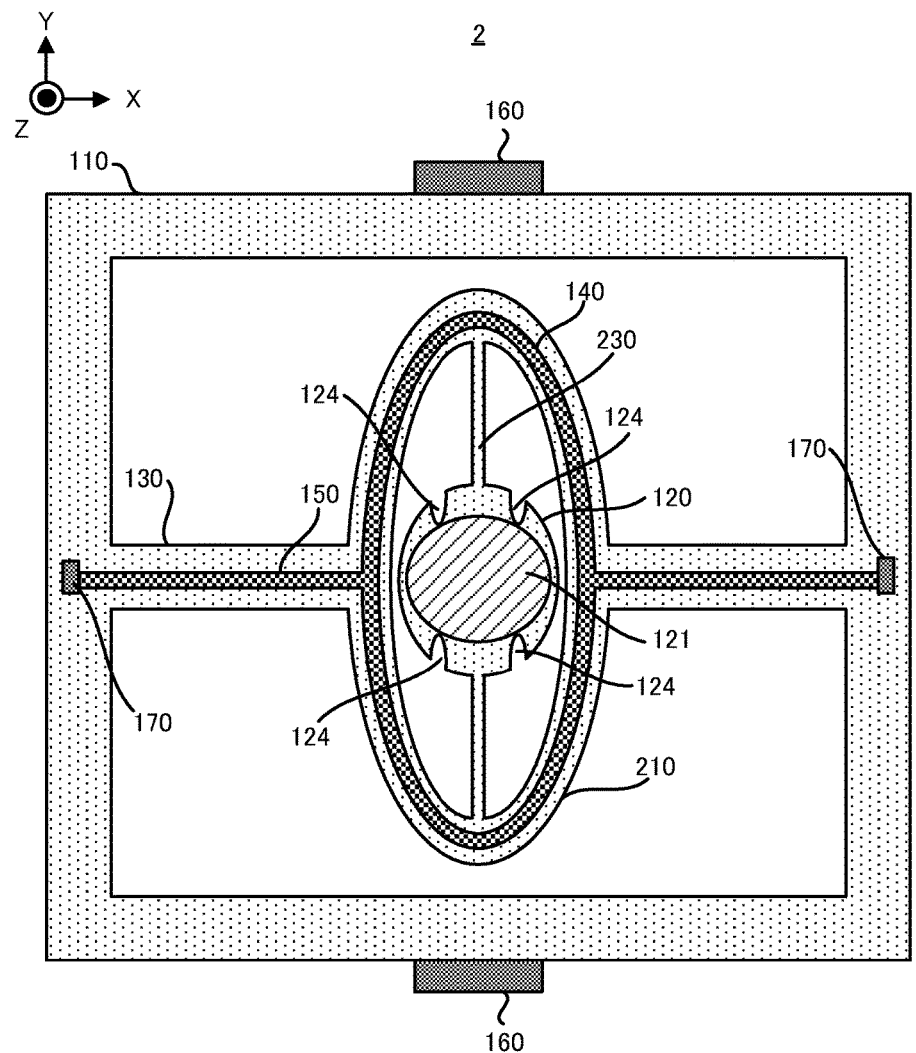

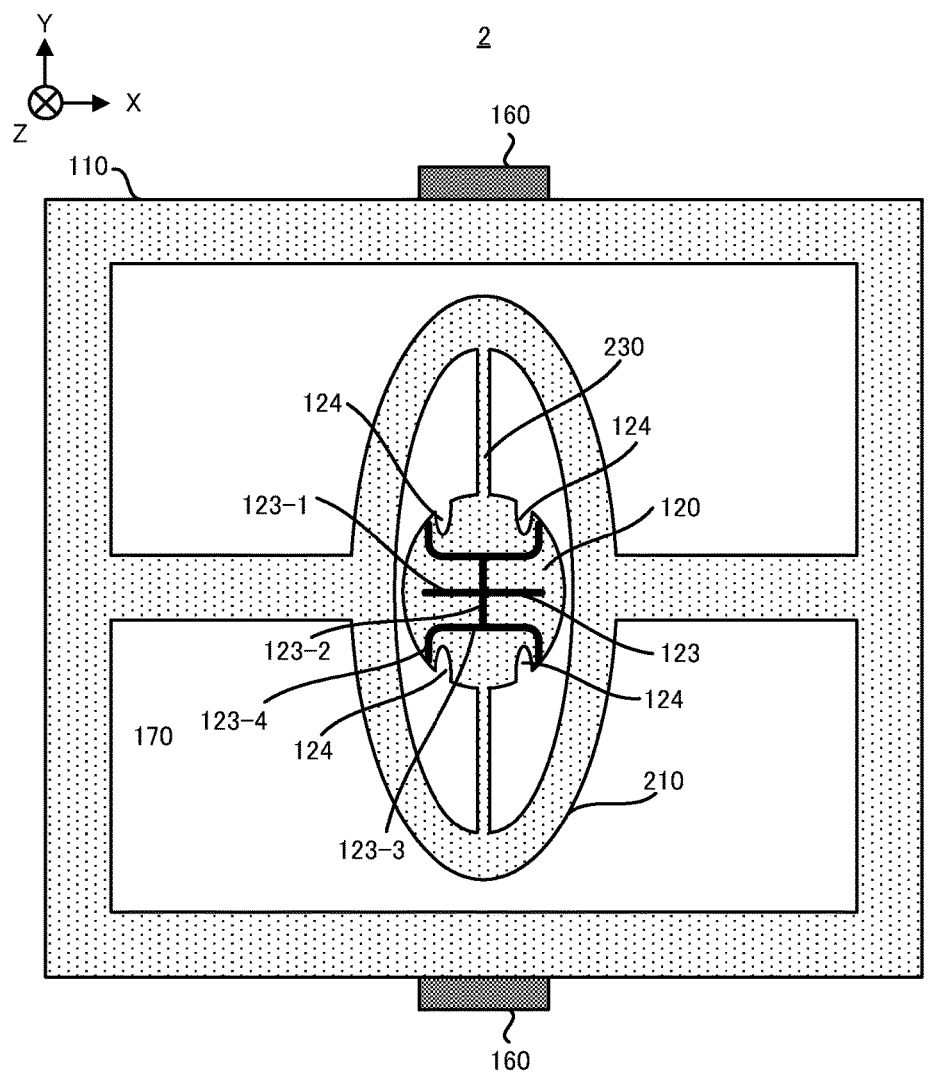
[FIG. 10]

[FIG. 11]
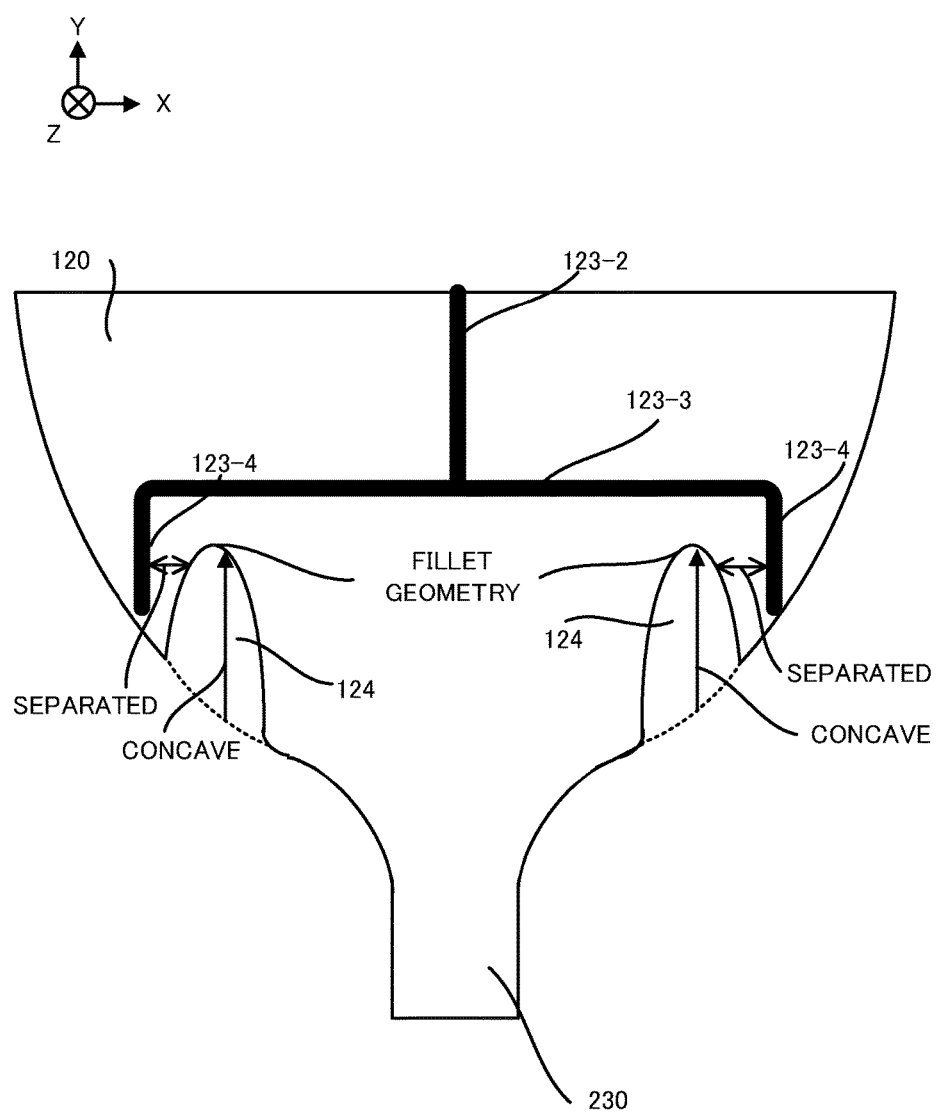

[FIG. 12]
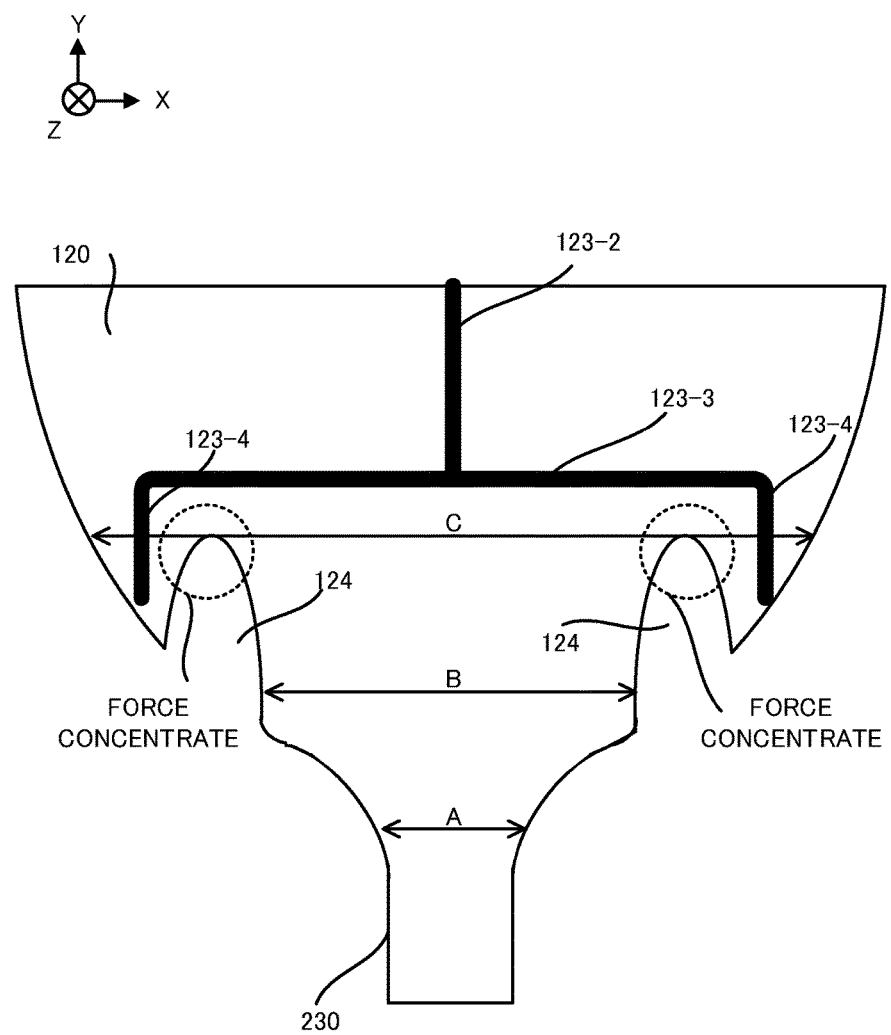

[FIG. 13]
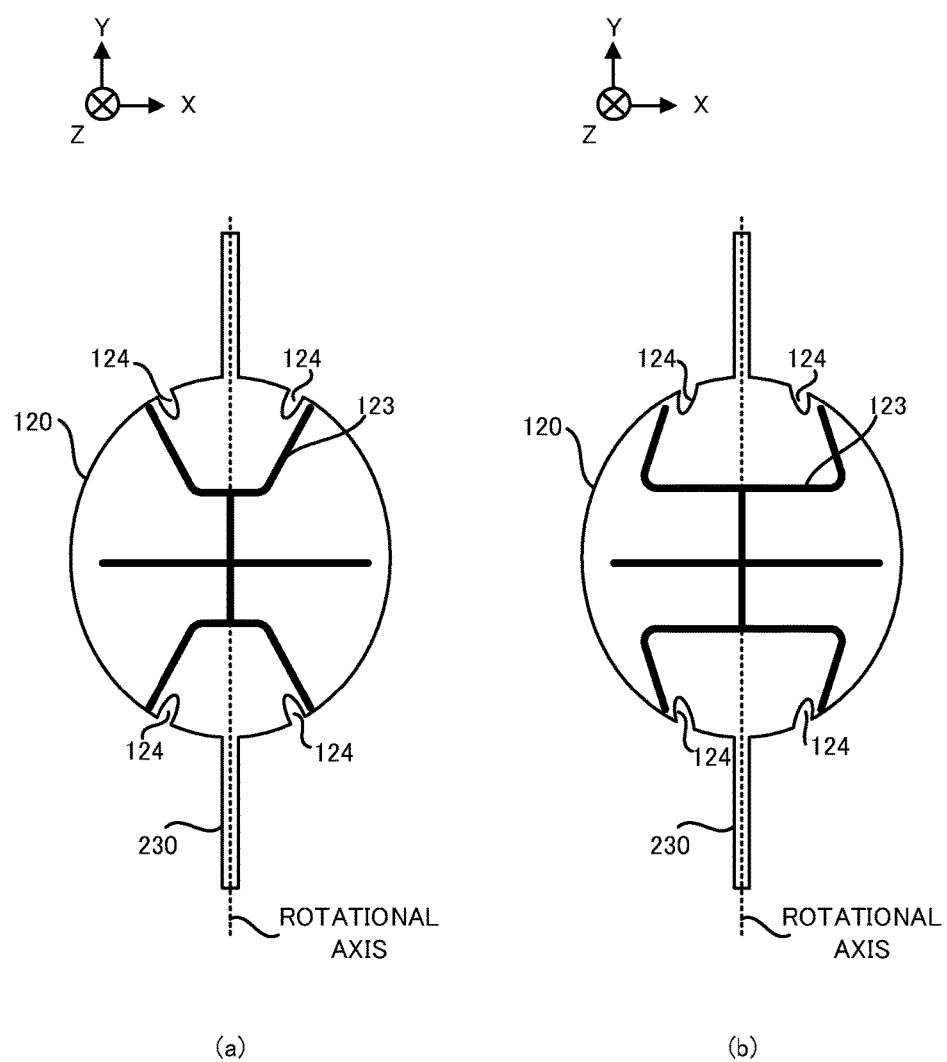
(a)　　　　　　　　　(b)

[FIG. 14]
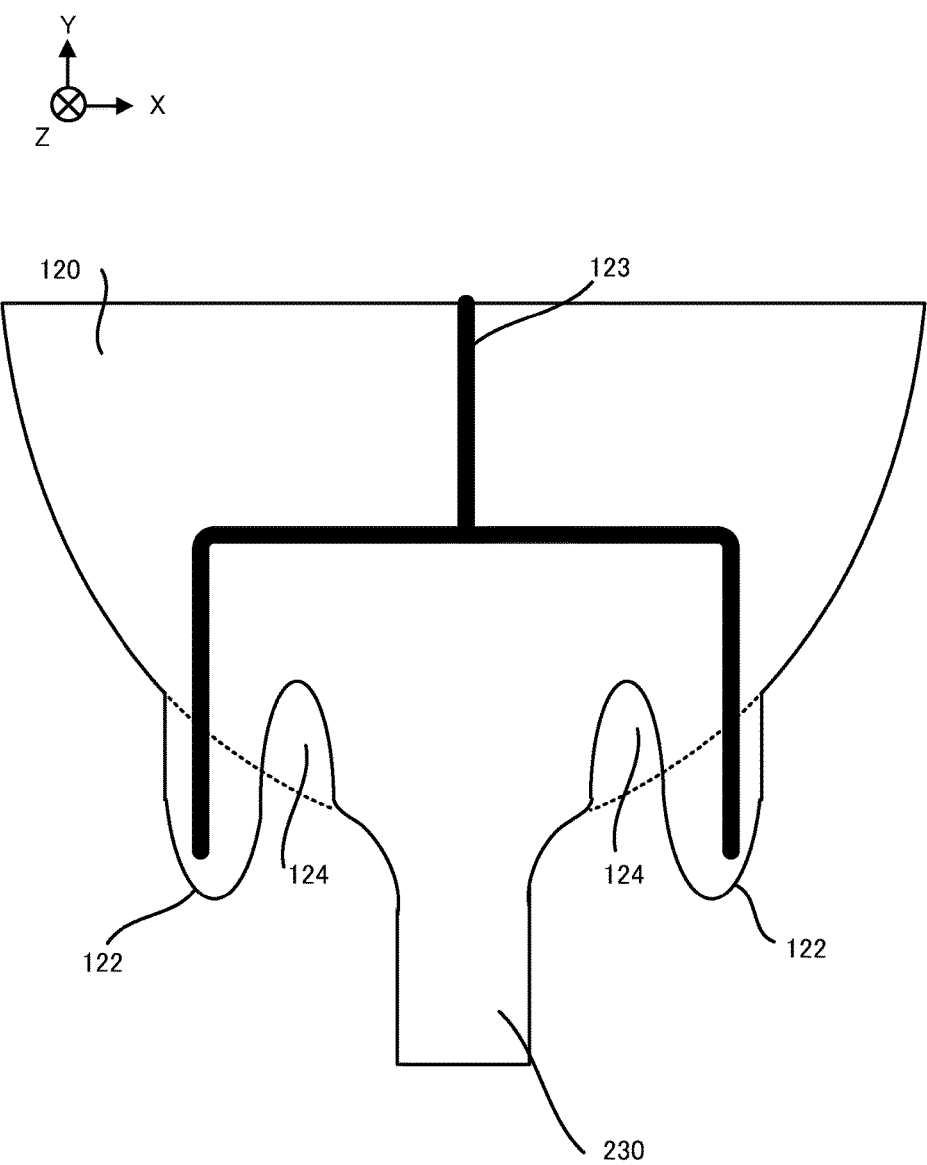

[FIG. 15]
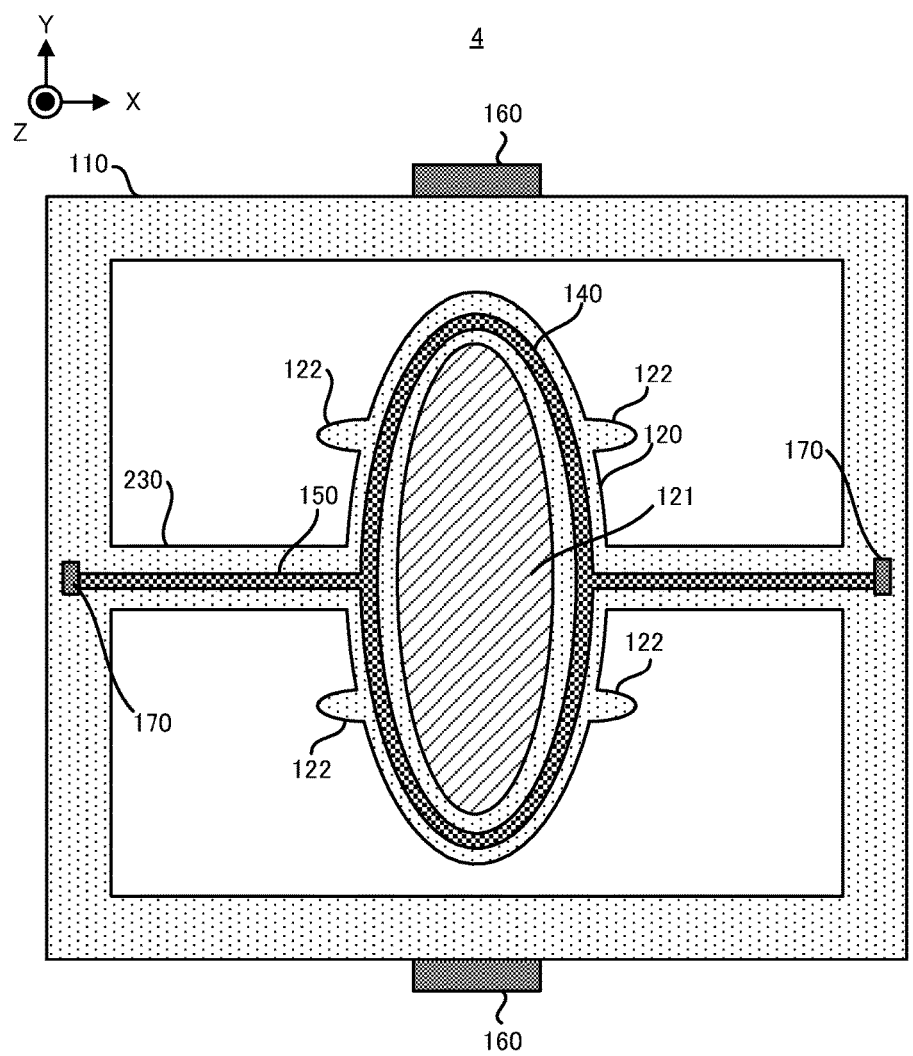

[FIG. 16]
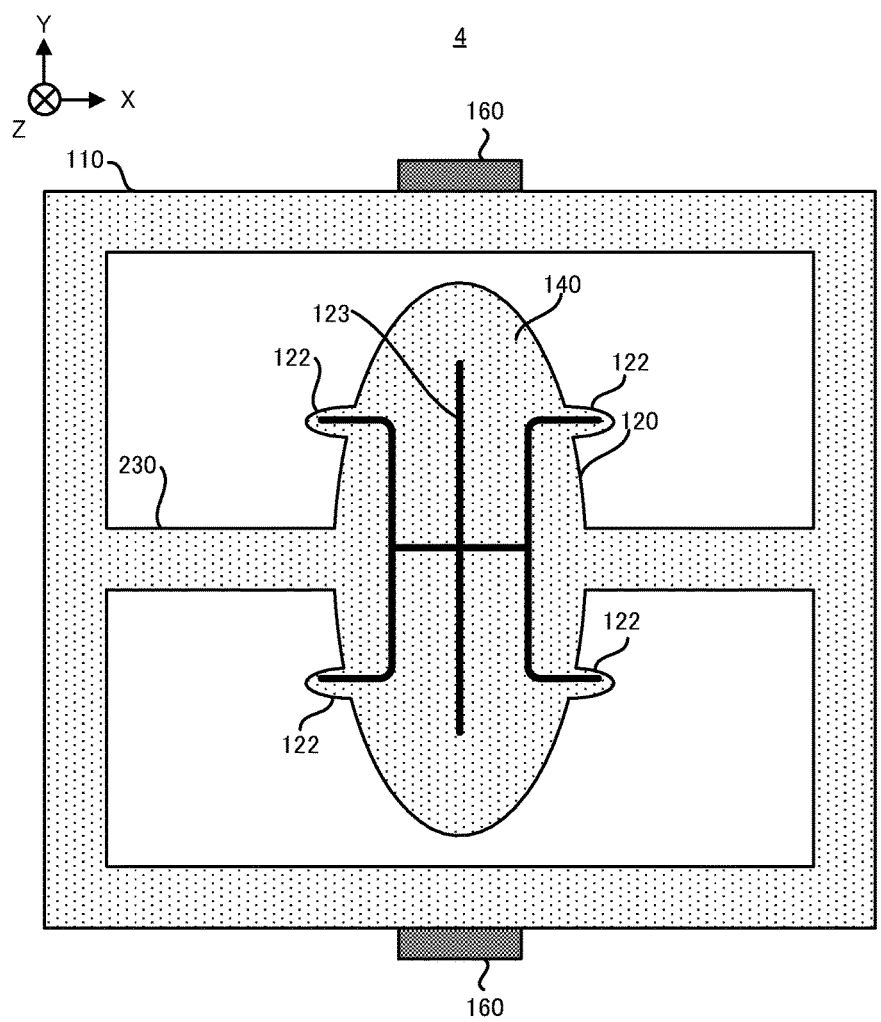

ACTUATOR

TECHNICAL FIELD

The present invention relates to an actuator, such as a MEMS scanner, for driving a movable portion on which a mirror or the like is disposed.

BACKGROUND ART

In various technical fields such as, for example, a display, a printing apparatus, precision measurement, precision processing, and information recording-reproduction, a micro electro mechanical system (MEMS) device which is manufactured by a semiconductor fabrication technology is actively researched. As the above described MEMS device, a MEMS scanner which is used for a scanning with a laser light is known. The MEMS scanner has a movable plate; a supporting frame which surrounds the movable plate; and a torsion bar which coupled the movable plate with the supporting frame such that the movable plates swings.

In the MEMS scanner, a force (for example, a force for twisting the torsion bar) is usually applied to the torsion bar to swing the movable plate. However, when the twisting force is applied to the torsion bar, the force is often applied to not only the torsion bar but also one portion or whole of the movable plate. The force which is applied to the movable plate results in a deformation of the movable plate.

However, the deformation of the movable plate results in a deformation of a mirror or the like which is disposed on the movable plate. The deformation of the mirror or the like is undesirable, because it results in a reduction of a precision of the scanning with the laser light. Therefore, a technology which forms a protruding rib on a surface of the movable plate (typically, a surface of the movable plate which is opposite to a surface on which the mirror is disposed) is proposed to suppress the deformation of the movable plate (namely, to maintain a flatness of the movable plate) (for example, refer to Patent Literatures 1 to 3.

CITATION LIST

Patent Literature

Patent Literature 1: Japanese Patent Application Laid Open No. 2003-172897
Patent Literature 2: Japanese Patent Application Laid Open No. 2007-310342
Patent Literature 3: Japanese Patent Application Laid Open No. 2005-308820

SUMMARY OF INVENTION

Technical Problem

Although the deformation of the movable plate can be suppressed by the rib which is formed on the movable plate, the force which is applied to a connecting portion between the rib and the movable plate (in other words, to a base of the rib) may possibly increase, which is a technical problem. In other words, the force concentrates at the connecting portion between the rib and the movable plate, which is a technical problem. As a result, the increase of the force results in a destruction of the rib and the movable plate (alternatively, a detachment of the rib from the movable plate).

On the other hand, the force which is applied to the movable plate when the twisting force is applied to the torsion bar tends to become larger, as an area portion to which the force is applied is closer to the torsion bar. Thus, forming the rib at an area portion which is as far from the torsion bar as possible is anticipated as one countermeasure for suppressing the concentration of the force at the connecting portion between the rib and the movable plate. However, if the rib is formed at the area portion which is as far from the torsion bar as possible (for example, the rib is formed near the center of the movable plate), it may be difficult to suppress the deformation of the movable plate.

Therefore, forming the rib which extends along a rotational axis of the movable plate at an area portion other than a connecting portion between the torsion bar and the movable plate where the force is easy to concentrate is anticipated as another countermeasure from a viewpoint of avoiding the concentration of the force at the connecting portion between the rib and the movable portion and suppressing the deformation of the movable plate. However, even if this countermeasure is used, the force concentrates at the connecting portion between the rib and the movable plate near an edge portion of the rib.

The present invention is invented on the basis of the above described conventional problem, and it is therefore an object of the present invention to provide an actuator which is capable of suppressing the force which is applied to the connecting portion between the rib and the movable portion.

Solution to Problem

In order to solve the above object, the first actuator is provided with: a planar movable portion; a supporting portion which supports the movable portion; and a torsion bar which connects the movable portion and the supporting portion along a longitudinal direction thereof such that the movable portion swings around a rotational axis which is along the longitudinal direction, a rib being formed on a surface of the movable portion, the rib maintaining a flatness of the movable portion, the movable portion having a protruding portion near a connecting portion between the torsion bar and the movable portion, the protruding portion protruding in a direction along the surface and protruding toward an outside of the movable portion than a surrounding area portion, at least one portion of the rib being formed on the surface to extend on the protruding portion.

In order to solve the above object, the second actuator is provided with: a planar movable portion; a supporting portion which supports the movable portion; and a torsion bar which connects the movable portion and the supporting portion along a longitudinal direction thereof such that the movable portion swings around a rotational axis which is along the longitudinal direction, a rib being formed on a surface of the movable portion, the rib maintaining a flatness of the movable portion, a cut portion being formed at the movable portion, the cut portion extending in the direction along the surface and extending toward an inside of the movable portion than a surrounding area portion, at least one portion of the rib being formed on the surface to extend adjacently to the cut portion such that the cut portion is located between the rib and the rotational axis.

An operation and an advantage in the present invention will become apparent from the embodiments explained below.

BRIEF DESCRIPTION OF DRAWINGS

FIG. 1 is a plan view illustrating one example of the structure of the actuator in the first example which is viewed from an upper side.

FIG. 2 are plan views illustrating one example of the structure of the actuator in the first example which is viewed from a lower side.

FIG. 3 are enlarged lower views illustrating one portion of the lower surface of the movable portion.

FIG. 4 is an enlarged lower view illustrating one portion of the lower surface of the movable portion.

FIG. 5 is an enlarged lower view illustrating one portion of the lower surface of the movable portion in an actuator of a comparison example which does not have the protruding portions.

FIG. 6 is an enlarged lower view illustrating the movable portion in an actuator of another comparison example which does not have the protruding portions.

FIG. 7 are lower view and side view illustrating the movable portion in the first example.

FIG. 8 are lower views illustrating another example of the movable portion in the first example.

FIG. 9 is a plan view illustrating one example of the structure of the actuator in the second example which is viewed from an upper side.

FIG. 10 is a plan view illustrating one example of the structure of the actuator in the second example which is viewed from a lower side.

FIG. 11 is an enlarged lower view illustrating one portion of the lower surface of the movable portion.

FIG. 12 is an enlarged lower view illustrating one portion of the lower surface of the movable portion.

FIG. 13 are lower views illustrating another example of the movable portion in the second example.

FIG. 14 is an enlarged lower view illustrating one portion of a lower surface of the movable portion which the actuator in the third example is provided with.

FIG. 15 is a plan view illustrating one example of the structure of the actuator in the fourth example which is viewed from an upper side.

FIG. 16 is a plan view illustrating one example of the structure of the actuator in the fourth example which is viewed from a lower side.

DESCRIPTION OF EMBODIMENT

Hereinafter, an explanation will be given to an embodiment of the actuator in order.

Actuator in a First Embodiment

<1>

An actuator in the first embodiment is provided with: a planar movable portion; a supporting portion which supports the movable portion; and a torsion bar which connects the movable portion and the supporting portion along a longitudinal direction thereof such that the movable portion swings around a rotational axis which is along the longitudinal direction, a rib being formed on a surface of the movable portion, the rib maintaining a flatness of the movable portion, the movable portion having a protruding portion near a connecting portion between the torsion bar and the movable portion, the protruding portion protruding in a direction along the surface and protruding toward an outside of the movable portion than a surrounding area portion, at least one portion of the rib being formed on the surface to extend on the protruding portion.

According to the actuator in the first embodiment, the movable portion which is suspended by the torsion bar swings. For example, the movable portion may swing to rotate around the rotational axis which is an axis in a direction along which the torsion bar extends (namely, the longitudinal direction of the torsion bar).

In order to rotate the movable portion in the above described manner, the torsion bar connects the movable portion and the supporting portion along the longitudinal direction of the torsion bar. The torsion bar may directly connects the movable portion and the supporting portion. The torsion bar may indirectly connects the movable portion and the supporting portion (in other words, via any component between them).

The rib is formed on the surface of the movable portion. The rib is formed mainly for the purpose of maintaining the flatness of the movable portion (in other words, suppressing a deformation of the movable portion or maintaining a stiffness of the movable portion). In order to achieve this purpose, it is preferable that the rib have a convex shape protruding from the surface of the movable portion (in other words, a shape protruding along a normal line of the movable portion).

Especially in the first embodiment, the movable portion has the protruding portion. The protruding portion is an area portion which protrudes in the direction along the surface of the movable portion and toward the outside of the movable portion (in other words, to draw away from a center of the movable portion) than another area portion (typically, the surrounding area portion) which is different from the protruding portion. In other words, the protruding portion is an area portion which protrudes, from a virtual outer edge of the movable portion, in the direction along the surface of the movable portion and toward the outside of the movable portion, wherein the virtual outer edge is presumed on the basis of the surrounding area portion without considering the protruding portion.

It is preferable that the movable portion have the above described protruding portion near the connecting portion between the torsion bar and the movable portion. Incidentally, the term "near the connecting portion between the torsion bar and the movable portion" may represent an area portion whose distance from the connecting portion between the torsion bar and the movable portion is equal to or less than a predetermined distance. Alternatively, the term "near the connecting portion between the torsion bar and the movable portion" may represent a position which is closer to the connecting portion between the torsion bar and the movable portion than to the center of the movable portion (for example, a center or a gravity center of the movable portion). However, it is preferable that the term "near the connecting portion between the torsion bar and the movable portion" represent a position which is away from the connecting portion between the torsion bar and the movable portion by some distance while being as close to the connecting portion between the torsion bar and the movable portion as possible.

In the first embodiment, at least one portion of the rib is formed on the surface of the movable portion to extend on the protruding portion which the movable portion has. Namely, at least one portion of the rib is formed on the surface of the movable portion to protrude in the direction along the surface of the movable portion and toward the outside of the movable portion with the protruding portion. Incidentally, at least one portion of the rib may be formed to extend on one portion of the protruding portion, or may be formed to extend over whole of the protruding portion. Moreover, the rib may further protrude from the protruding portion in the direction along the surface of the movable portion and toward the outside of the movable portion.

The above described actuator in the first embodiment is capable of relaxing the force which is applied to the connecting portion between the rib and the movable portion due to the swing of the movable portion, as described later in detail with reference to a drawing, because the rib extends on the protruding portion. In other words, it is possible to preventing the force from concentrating at the connecting portion between the rib and the movable portion due to the swing of the movable portion.

<2>

In another aspect of the actuator in the first example, the movable portion has the protruding portion at a position corresponding to the rib which is formed to be closest to the connecting portion between the torsion bar and the movable portion.

According to this aspect, the movable portion has the protruding portion at the position corresponding to the rib which is formed to be closest to the connecting portion between the torsion bar and the movable portion, because the force applied to the rib which is formed to be closest to the connecting portion between the torsion bar and the movable portion becomes larger easily. Thus, it is possible to relax the force which is applied to the connecting portion between the rib and the movable portion due to the swing of the movable portion.

<3>

In another aspect of the actuator in the first example, the protruding portion protrudes to draw away from the rotational axis.

According to this aspect, it is possible to relax the force which is applied to the connecting portion between the rib and the movable portion due to the swing of the movable portion, as described later in detail with reference to a drawing, because the protruding portion protrudes to draw away from the rotational axis (in other words, the rib extends on the protruding portion which protrudes to draw away from the rotational axis).

<4>

In another aspect of the actuator in the first example, the protruding portion protrudes along the rotational axis.

According to this aspect, an inertial moment of the movable portion (namely, an inertial moment around the rotational axis) can be reduced than that in the case where the protruding portion does not protrude along the rotational axis.

<5>

In another aspect of the actuator in the first example, the protruding portion protrudes to come close to the rotational axis.

According to this aspect, the rib for maintaining the flatness of the movable portion can be formed to be away from the connecting portion between the torsion bar and the movable portion, to which relatively large force is applied, by some distance, as described later in detail with reference to a drawing.

<6>

In another aspect of the actuator in the first example, an outer edge of the rib at the rotational axis side is located at a position which shifts from an outer edge of the protruding portion at the rotational axis side to draw away from the rotational axis.

According to this aspect, an area portion of the movable portion on which the rib is not formed and an area portion of the movable portion on which the rib is formed are located on the protruding portion in this order from the rotational axis along a direction which intersects with (typically, is perpendicular to) the rotational axis. Namely, the rib is formed on the protruding portion such that the area portion on which the rib is not formed is prepared between the rotational axis and the rib. Therefore, it is possible to relax the force which is applied to the connecting portion between the rib and the movable portion due to the swing of the movable portion.

<7>

In another aspect of the actuator in the first example, at least one portion of a border portion between the protruding portion and the surrounding area portion is chamfered, curved or rounded or has a fillet geometry.

According to this aspect, it is possible to intentionally concentrate the force due to the swing of the movable portion at the border portion between the protruding portion and the surrounding area portion (for example, at least one portion of the border portion which is chamfered). As a result, it is possible to relax the force which is applied to the connecting portion between the rib and the movable portion due to the swing of the movable portion.

In addition, it is possible to prevent the force from excessively concentrating in an inside of the border portion, because the border portion between the protruding portion and the surrounding area portion is curved relatively smoothly. Namely, it is possible to concentrate the force at the border portion in the case where we focus whole of the movable portion having the border portion and it is possible to disperse the force in the border portion in the case where we focus the border portion.

<8>

In another aspect of the actuator in the first example, a cut portion is formed at the movable portion, the cut portion extends in the direction along the surface and extends toward an inside of the movable portion than a surrounding area portion, at least one portion of the rib is formed on the surface to extend adjacently to the cut portion such that the cut portion is located between the rib and the rotational axis According to this aspect, the cut portion is further formed at the movable portion. The cut portion is an area portion which extends in the direction along the surface of the movable portion and toward the inside of the movable portion (in other words, to come close to the center of the movable portion) than another area portion (typically, the surrounding area portion) which is different from the cut portion. In other words, the cut portion is an area portion which extends from a virtual outer edge of the movable portion in the direction along the surface of the movable portion and toward the inside of the movable portion, wherein the virtual outer edge is presumed on the basis of the surrounding area portion without considering the cut portion.

It is preferable that the above described cut portion be formed at the movable portion near the connecting portion between the torsion bar and the movable portion. Incidentally, the term "near the connecting portion between the torsion bar and the movable portion" may represent an area portion whose distance from the connecting portion between the torsion bar and the movable portion is equal to or less than a predetermined distance. Alternatively, the term "near the connecting portion between the torsion bar and the movable portion" may represent a position which is closer to the connecting portion between the torsion bar and the movable portion than to the center of the movable portion (for example, a center or a gravity center of the movable portion). However, it is preferable that the term "near the connecting portion between the torsion bar and the movable portion" represent a position which is away from the connecting portion between the torsion bar and the movable portion by some distance while being as close to the connecting portion between the torsion bar and the movable portion as possible.

Incidentally, it is preferable that the cut portion penetrate a structure which constitutes the movable portion along the direction which intersects with (typically, is perpendicular to) the surface of the movable portion. Namely, it is preferable that the cut portion is an area portion at which the structure which constitutes the movable portion does not exist.

In this aspect, at least one portion of the rib is formed on the surface of the movable portion to extend adjacently to the cut portion. Moreover, at least one portion of the rib is formed on the surface of the movable portion such that the cut portion is located between the rib and the rotational axis. Namely, at least one portion of the rib is formed such that the cut portion and the rib are located in this order from the rotational axis. Incidentally, the rib may protrude in the direction along the surface of the movable portion and toward the outside of the movable portion Here, the surrounding area portion which is adjacent to the cut portion (especially, an area portion which is farther from the rotational axis than the cut portion is, and an area portion on which the rib is formed) is substantially an area portion which protrudes in the direction along the surface of the movable portion and toward the outside of the movable portion (in other words, to draw away from a center of the movable portion). Therefore, the rib is substantially formed on the surface of the movable portion to protrude in the direction along the surface of the movable portion and toward the outside of the movable portion. Incidentally, the rib may be formed to be adjacent to one portion of the cut portion, or may be formed to be adjacent to whole of the cut portion.

Therefore, it is possible to relax the force which is applied to the connecting portion between the rib and the movable portion due to the swing of the movable portion, as described later in detail with reference to a drawing, because the rib extends adjacently to the cut portion. In other words, it is possible to preventing the force from concentrating at the connecting portion between the rib and the movable portion due to the swing of the movable portion.

Especially, since both of the protruding portion and the cut portion are formed at the movable portion, it is possible to relax the force which is applied to the connecting portion between the rib and the movable portion due to the swing of the movable portion more appropriately, than an actuator in which either one of the protruding portion and the cut portion is formed. In other words, it is possible to preventing the force from concentrating at the connecting portion between the rib and the movable portion due to the swing of the movable portion more appropriately.

Actuator in Second Embodiment

<9>

The actuator in the second example is provided with: a planar movable portion; a supporting portion which supports the movable portion; and a torsion bar which connects the movable portion and the supporting portion along a longitudinal direction thereof such that the movable portion swings around a rotational axis which is along the longitudinal direction, a rib being formed on a surface of the movable portion, the rib maintaining a flatness of the movable portion, a cut portion being formed at the movable portion, the cut portion extending in the direction along the surface and extending toward an inside of the movable portion than a surrounding area portion, at least one portion of the rib being formed on the surface to extend adjacently to the cut portion such that the cut portion is located between the rib and the rotational axis.

According to the actuator in the second embodiment, the movable portion which is suspended by the torsion bar swings. For example, the movable portion may swing to rotate around the rotational axis which is an axis in a direction along which the torsion bar extends (namely, the longitudinal direction of the torsion bar).

In order to rotate the movable portion in the above described manner, the torsion bar connects the movable portion and the supporting portion along the longitudinal direction of the torsion bar. The torsion bar may directly connects the movable portion and the supporting portion. The torsion bar may indirectly connects the movable portion and the supporting portion (in other words, via any component between them).

The rib is formed on the surface of the movable portion. The rib is formed mainly for the purpose of maintaining the flatness of the movable portion (in other words, suppressing a deformation of the movable portion or maintaining a stiffness of the movable portion). In order to achieve this purpose, it is preferable that the rib have a shape protruding along a normal line of the movable portion.

Especially in the second embodiment, the cut portion is further formed at the movable portion. The cut portion is an area portion which extends in the direction along the surface of the movable portion and toward the inside of the movable portion (in other words, to come close to the center of the movable portion) than another area portion (typically, the surrounding area portion) which is different from the cut portion. In other words, the cut portion is an area portion which extends from a virtual outer edge of the movable portion in the direction along the surface of the movable portion and toward the inside of the movable portion, wherein the virtual outer edge is presumed on the basis of the surrounding area portion without considering the cut portion.

It is preferable that the above described cut portion be formed at the movable portion near the connecting portion between the torsion bar and the movable portion. Incidentally, the term "near the connecting portion between the torsion bar and the movable portion" may represent an area portion whose distance from the connecting portion between the torsion bar and the movable portion is equal to or less than a predetermined distance. Alternatively, the term "near the connecting portion between the torsion bar and the movable portion" may represent a position which is closer to the connecting portion between the torsion bar and the movable portion than to the center of the movable portion (for example, a center or a gravity center of the movable portion). However, it is preferable that the term "near the connecting portion between the torsion bar and the movable portion" represent a position which is away from the connecting portion between the torsion bar and the movable portion by some distance while being as close to the connecting portion between the torsion bar and the movable portion as possible.

Incidentally, it is preferable that the cut portion penetrate a structure which constitutes the movable portion along the direction which intersects with (typically, is perpendicular to) the surface of the movable portion. Namely, it is preferable that the cut portion is an area portion at which the structure which constitutes the movable portion does not exist.

In the second embodiment, at least one portion of the rib is formed on the surface of the movable portion to extend adjacently to the cut portion. Moreover, at least one portion of the rib is formed on the surface of the movable portion such that the cut portion is located between the rib and the rotational axis. Namely, at least one portion of the rib is formed such that the cut portion and the rib are located in this order from the rotational axis. Incidentally, the rib may protrude in the direction along the surface of the movable portion and toward the outside of the movable portion Here, the surrounding area portion which is adjacent to the cut portion (especially, an area portion which is farther from the rotational axis than the cut portion is, and an area portion on which the rib is formed) is substantially an area portion which protrudes in the direction along the surface of the movable portion and toward the outside of the movable portion (in other words, to draw away from a center of the movable portion). Therefore, the rib is substantially formed on the surface of the movable portion to protrude in the direction along the surface of the movable portion and toward the outside of the movable portion, in the second embodiment as with the first embodiment. Incidentally, the rib may be formed to be adjacent to one portion of the cut portion, or may be formed to be adjacent to whole of the cut portion.

The above described actuator in the second embodiment is capable of relaxing the force which is applied to the connecting portion between the rib and the movable portion due to the swing of the movable portion, as described later in detail with reference to a drawing, because the rib extends adjacently to the cut portion. In other words, it is possible to preventing the force from concentrating at the connecting portion between the rib and the movable portion due to the swing of the movable portion.

<10>

In another aspect of the actuator in the second example, the cut portion is formed at a position of the movable portion corresponding to the rib which is formed to be closest to the connecting portion between the torsion bar and the movable portion.

According to this aspect, the cut portion is formed at the position of the movable portion corresponding to the rib which is formed to be closest to the connecting portion between the torsion bar and the movable portion, because the force applied to the rib which is formed to be closest to the connecting portion between the torsion bar and the movable portion becomes larger easily. Thus, it is possible to relax the force which is applied to the connecting portion between the rib and the movable portion due to the swing of the movable portion.

<11>

In another aspect of the actuator in the second example, the cut portion extends to come close to the rotational axis.

According to this aspect, the rib which is formed to be adjacent to the cut portion substantially extends to protrude to draw away from the rotational axis, because the cut portion extends to come close to the rotational axis, as described later in detail with reference to a drawing. Therefore, it is possible to relax the force which is applied to the connecting portion between the rib and the movable portion due to the swing of the movable portion

<12>

In another aspect of the actuator in the second example, the cut portion extends along the rotational axis.

According to this aspect, an inertial moment of the movable portion (namely, an inertial moment around the rotational axis) can be reduced than that in the case where the cut portion does not extend along the rotational axis.

<13>

In another aspect of the actuator in the second example, the cut portion extends to draw away from the rotational axis.

According to this aspect, the rib for maintaining the flatness of the movable portion can be formed to draw away from the connecting portion between the torsion bar and the movable portion, to which relatively large force is applied, by some distance, as described later in detail with reference to a drawing.

<14>

In another aspect of the actuator in the second example, an outer edge of the rib at the rotational axis side is located at a position which shifts from an outer edge of the cut portion at a side opposite to the rotational axis side to draw away from the rotational axis.

According to this aspect, an area portion of the movable portion on which the rib is not formed and an area portion of the movable portion on which the rib is formed are located in this order from the rotational axis along a direction which intersects with (typically, is perpendicular to) the rotational axis. Namely, the rib is formed such that the area portion of the movable portion on which the rib is not formed is prepared between the rotational axis and the rib and between the cut portion and the rib. Therefore, it is possible to relax the force which is applied to the connecting portion between the rib and the movable portion due to the swing of the movable portion.

<15>

In another aspect of the actuator in the second example, at least one portion of an outer edge of the movable portion which is defined by the cut portion is chamfered, curved or rounded or has a fillet geometry.

According to this aspect, it is possible to intentionally concentrate the force due to the swing of the movable portion at the outer edge of the movable portion which is defined by the cut portion (for example, at least one portion of the outer edge which is chamfered). As a result, it is possible to relax the force which is applied to the connecting portion between the rib and the movable portion due to the swing of the movable portion.

In addition, it is possible to prevent the force from excessively concentrating in an inside of the outer edge, because the outer edge of the movable portion which is defined by the cut portion is curved relatively smoothly. Namely, it is possible to concentrate the force at the outer edge of the movable portion which is defined by the cut portion in the case where we focus whole of the movable portion having the above described outer edge and it is possible to disperse the force in the outer edge of the movable portion which is defined by the cut portion in the case where we focus the outer edge of the movable portion which is defined by the cut portion.

<16>

In another aspect of the actuator in the second example, the movable portion has a protruding portion near a connecting portion between the torsion bar and the movable portion, the protruding portion protrudes in a direction along the surface and protrudes toward an outside of the movable portion than a surrounding area portion, at least one portion of the rib is formed on the surface to extend on the protruding portion.

According to this aspect, the movable portion has the protruding portion. The protruding portion is an area portion which protrudes in the direction along the surface of the movable portion and toward the outside of the movable portion (in other words, to draw away from a center of the movable portion) than another area portion (typically, the surrounding area portion) which is different from the protruding portion. In other words, the protruding portion is an area portion which protrudes, from a virtual outer edge of the movable portion, in the direction along the surface of the movable portion and toward the outside of the movable portion, wherein the virtual outer edge is presumed on the basis of the surrounding area portion without considering the protruding portion.

It is preferable that the movable portion have the above described protruding portion near the connecting portion between the torsion bar and the movable portion. Incidentally, the term "near the connecting portion between the torsion bar and the movable portion" may represent an area portion whose distance from the connecting portion between the torsion bar and the movable portion is equal to or less than a predetermined distance. Alternatively, the term "near the connecting portion between the torsion bar and the movable portion" may represent a position which is closer to the connecting portion between the torsion bar and the movable portion than to the center of the movable portion (for example, a center or a gravity center of the movable portion). However, it is preferable that the term "near the connecting portion between the torsion bar and the movable portion" represent a position which is away from the connecting portion between the torsion bar and the movable portion by some distance while being as close to the connecting portion between the torsion bar and the movable portion as possible.

In this aspect, at least one portion of the rib is formed on the surface of the movable portion to extend on the protruding portion which the movable portion has. Namely, at least one portion of the rib is formed on the surface of the movable portion to protrude in the direction along the surface of the movable portion and toward the outside of the movable portion with the protruding portion. Incidentally, at least one portion of the rib may be formed to extend on one portion of the protruding portion, or may be formed to extend over whole of the protruding portion. Moreover, the rib may further protrude from the protruding portion in the direction along the surface of the movable portion and toward the outside of the movable portion.

Therefore, it is possible to relax the force which is applied to the connecting portion between the rib and the movable portion due to the swing of the movable portion, as described later in detail with reference to a drawing, because the rib extends on the protruding portion. In other words, it is possible to preventing the force from concentrating at the connecting portion between the rib and the movable portion due to the swing of the movable portion.

Especially, since both of the protruding portion and the cut portion are formed at the movable portion, it is possible to relax the force which is applied to the connecting portion between the rib and the movable portion due to the swing of the movable portion more appropriately, than an actuator in which either one of the protruding portion and the cut portion is formed. In other words, it is possible to preventing the force from concentrating at the connecting portion between the rib and the movable portion due to the swing of the movable portion more appropriately.

These operation and other advantages in the present embodiment will become more apparent from the examples explained below.

As explained above, the actuator in the first embodiment is provided with: the movable portion, the supporting portion and the torsion bar, and the rib is formed to extend on the protruding portion of the movable portion. The actuator in the second embodiment is provided with: the movable portion, the supporting portion and the torsion bar, the rib is formed to extend adjacently to the cut portion of the movable portion. Therefore, it is possible to relax the force which is applied to the connecting portion between the rib and the movable portion due to the swing of the movable portion.

EXAMPLES

Hereinafter, with reference to the drawings, examples will be explained.

(1) First Example

Firstly, with reference to FIG. 1 and FIG. 2, an actuator 1 in a first example will be explained. FIG. 1 is a plan view illustrating one example of the structure of the actuator 1 in the first example which is viewed from an upper side. FIG. 2 are plan views illustrating one example of the structure of the actuator 1 in the first example which is viewed from a lower side. Incidentally, in FIG. 1 and FIG. 2 (moreover, FIG. 3 to FIG. 8), the actuator 1 is explained by using a virtual three dimensional space which is defined by an X axis, a Y axis and a Z axis.

As illustrated in FIG. 1 and FIG. 2(a), the actuator 1 in the first example is a planar type electro-magnetic driving actuator (namely, a MEMS scanner) which is used to performing a scanning with a laser light. The actuator 1 is provided with: an outer support body 110, a pair of torsion bars 130, an inner support body 210, a pair of torsion bars 230, a movable portion 120, a driving coil 140, a pair of permanent magnets 160 and a pair of supply terminals 170. Moreover, as illustrated in FIG. 1, a mirror 121 is formed on one surface (for example, an upper surface or a front surface) of the movable portion 120. Moreover, as illustrated in FIG. 2, a rib 123 is formed on the other surface (for example, a lower surface or a back surface) of the movable portion 120.

The outer support body 110, a pair of torsion bars 130, the inner support body 210, a pair of torsion bars 230, the movable portion 120 and the rib 123 are integrally formed from a non-magnetic substrate such as a silicon substrate, for example. Namely, the outer support body 110, a pair of torsion bars 130, the inner support body 210, a pair of torsion bars 230 and the movable portion 120 are formed by removing one portion of the non-magnetic substrate such as the silicon substrate and thus forming a space (void), for example. A MEMS process is preferably used as a forming process in this case. Incidentally, the outer support body 110, a pair of torsion bars 130, the inner support body 210, a pair of torsion bars 230, the movable portion 120 and the rib 123 may be integrally formed from any elastic material, instead of the silicon substrate.

The outer support body 110 has a frame shape which surrounds the inner support body 210. The outer support body 110 is connected to the inner support body 210 by a pair of torsion bars 130 each of which is located on respective one of both sides of the inner support body 210 (in other words, by a pair of torsion bars 130 by which the inner support body 210 is sandwiched from both sides of the inner support body 210). Incidentally, FIG. 1 and FIG. 2(a) illustrate an example in which the shape of the outer support body 110 is the frame shape. However, it goes without saying that the shape of the outer support body 110 is not limited to the frame shape. For example, the shape of the outer support body 110 may be a frame shape whose one portion is open.

The inner support body 210 has a frame shape which surrounds the movable portion 120. The inner support body 210 is supported by the outer support body 110 via a pair of torsion bars 130 so as to be capable of swinging around a rotational axis in a direction along which a pair of torsion bars 130 extends (namely, in a longitudinal direction of a pair of torsion bars 130, and a X axis direction in FIG. 1 and FIG. 2(*a*)). The inner support body 210 is further connected to the movable portion 120 by a pair of torsion bars 230 each of which is located on respective one of both sides of the movable portion 120 (in other words, by a pair of torsion bars 230 by which the movable portion 120 is sandwiched from both sides of the movable portion 120). The driving coil 140 is formed on the upper surface of the inner support body 210. However, the driving coil 140 may be formed in the inside or the lower surface of the inner support body 210. Incidentally, FIG. 1 and FIG. 2(*a*) illustrate an example in which the shape of the inner support body 210 is the frame shape. However, it goes without saying that the shape of the inner support body 210 is not limited to the frame shape. For example, the shape of the inner support body 210 may be a frame shape whose one portion is open.

The movable portion 120 is supported by the inner support body 210 via a pair of torsion bars 230 so as to be capable of swinging around a rotational axis in a direction along which a pair of torsion bars 230 extends (namely, in a longitudinal direction of a pair of torsion bars 230, and a Y axis direction in FIG. 1 and FIG. 2(*a*)).

As illustrated in FIG. 1, the mirror 121 which reflects the laser light is formed on the upper surface of the movable portion 120. The movable portion 120 on the upper surface of which the mirror 121 is formed is preferably a plate-like (or planar) component Moreover, it is preferable that a flatness of the mirror 121 be maintained for the mirror 121 to reflect the laser light appropriately. It is preferable that a flatness of the movable portion 120 be maintained to maintain the flatness of the mirror 121. Therefore, as illustrated in FIG. 2(*a*), the rib 123 is formed on the lower surface (namely, a surface which is opposite to a surface on which the mirror 121 is formed) of the movable portion 120, in order to maintain the flatness of the movable portion 120.

The rib 123 is formed to extend on the lower surface of the movable portion 120 in a desired manner by which the flatness of the movable portion 120 is maintained. In an example illustrated in FIG. 2(*a*), the rib 123 includes a first rib portion 123-1, a second rib portion 123-2, a third rib portion 123-3 and a fourth rib portion 123-4, wherein the first rib portion 123-1 goes through a center (or a vicinity of the center) of the movable portion 120 and extends along the rotational axis (for example, the X axis in FIG. 2(*a*)) of the inner support body 210 which supports the movable portion 120, the second rib portion 123-2 goes through the center (or the vicinity of the center) of the movable portion 120 and extends along the rotational axis (for example, the Y axis in FIG. 2(*a*)) of the movable portion 120, the third rib portion 123-3 extends along the rotational axis (for example, the X axis in FIG. 2(*a*)) of the inner support body 210 from an edge of the second rib portion 123-2, and the fourth rib portion 123-4 extends along the rotational axis (for example, the Y axis in FIG. 2(*a*)) of the movable portion 120 from an edge of the third rib portion 123-3. The above described extending manner of the rib 123 is determined from a viewpoint of separating the rib 123 from a connecting portion between the movable portion 120 and the torsion bar 230 (a connecting portion at which the movable portion 120 is connected to the torsion bar 230) while maintaining a stiffness of the movable portion 120 along the rotational axis (the Y axis) of the inner support body 210 and the rotational axis (the X axis) of the movable portion 120.

Incidentally, it goes without saying that the extending manner of the rib 123 illustrated in FIG. 2(*a*) is one example. Therefore, the rib 123 may extend in a manner which is different from the extending manner illustrated in FIG. 2(*a*). For example, as illustrated in FIG. 2(*b*), the rib 123 may include a circular first rib portion 123-1 and a second rib portion 123-2, wherein the center of the first rib portion 123-1 almost corresponds to the center of the movable portion 120, and the second rib portion 123-2 extends along the rotational axis (for example, the Y axis in FIG. 2(*b*)) of the movable portion 120 from the first rib portion 123-1.

A pair of torsion bars 130 connects the inner support body 210 and the outer support body 110 such that the inner support body 210 is capable of swinging with respect to the outer support body 110. The inner support body 210 swings by using the elasticity of a pair of torsion bars 130 such that an axis in a direction along which a pair of torsion bars 130 extends becomes the rotational axis. Namely, the inner support body 210 swings to rotate around the rotational axis which is the X axis in FIG. 1 and FIG. 2. In this case, the movable portion 120 is connected to the inner support body 210 via a pair of torsion bars 230. Therefore, the movable portion 120 substantially swings to rotate the rotational axis which is the X axis in FIG. 1 and FIG. 2, due to the swing of the inner support body 210.

Each of torsion bars 230 connects the inner support body 210 and the movable portion 120 such that the movable portion 120 is capable of swinging with respect to the inner support body 210. The movable portion 120 swings by using the elasticity of a pair of torsion bars 230 such that an axis in a direction along which a pair of torsion bars 230 extends becomes the rotational axis. Namely, the movable portion 120 swings to rotate around the rotational axis which is the Y axis in FIG. 1 and FIG. 2.

The driving coil 140 is a coil which extends on the inner support body 210, for example. The driving coil 140 may be made of a material (for example, gold, copper or the like) whose electrical conductivity is relatively high. Moreover, the driving coil 140 may be formed by using a semiconductor manufacturing process such as a plating process, a sputtering process and the like. Alternatively, the driving coil 140 may be embedded, by using an implanting process, in a silicon substrate which is used to form the outer support body 110, a pair of torsion bars 130, the inner support body 210, a pair of torsion bars 230, the movable portion 120 and the rib 123. Incidentally, in FIG. 1, the outline of the driving coil 140 is illustrated in a simplified manner for the purpose of improving the visualization of the drawing. However, the driving coil 140 is actually made of one or more winding formed on the surface of the inner support body 210.

Control current is supplied to the driving coil 140 from a power source via a pair of supply terminals 170 which is formed on the outer support body 110 and a wiring 150 which connects a pair of supply terminals 170 and the driving coil 140 and which is formed on a pair of torsion bars 130. The control current is a control current for swinging the inner support body 210 and the movable portion 120. The control current is typically an alternating current which includes a signal component whose frequency is synchronized with a swing frequency of the inner support body 210 and a signal component whose frequency is synchronized with a swing frequency of the movable portion 120. Incidentally, the power source may be a power source which the actuator 1 itself is provided with or may be a power source which is prepared outside of the actuator 1.

A pair of permanent magnets 160 is attached to the exterior of the outer support body 110. However, a pair of permanent magnets 160 may be attached to any position as long as a pair of permanent magnets 160 is capable of applying static magnetic field to the driving coil 140. It is preferable that a direction of a magnetic pole of a pair of permanent magnets 160 be set appropriately such that a pair of permanent magnets 160 applies a predetermined static magnetic field to the driving coil 140. Incidentally, a yoke may be attached to a pair of permanent magnets 160 in order to improve intensity of static magnetic field.

When the above described actuator 1 in the first example operates (specifically, when the movable portion 120 swings), firstly, the control current is supplied to the driving coil 140 via the supply terminals 170 and the wiring 150. In this case, the control current which is supplied to the driving coil 140 is preferably a current in which a signal for swinging the inner support body 210 (specifically, a signal which is synchronized with a cycle of the swing of the inner support body 210) and a signal for swinging the movable portion 120 (specifically, a signal which is synchronized with a cycle of the swing of the movable portion 120) are superimposed. On the other hand, the static magnetic field is applied to the driving coil 140 by a pair of permanent magnets 160. Therefore, a force (namely, Lorentz force) is generated in the driving coil 140 due to electromagnetic interaction between the static magnetic field applied from a pair of permanent magnets 160 and the control current supplied to the driving coil 140. As a result, the inner support body 210 on which the driving coil 140 is formed swings by the Lorentz force caused by the electromagnetic interaction between the static magnetic field applied from a pair of permanent magnet 160 and the control current supplied to the driving coil 140. Namely, the inner support body 210 swings to rotate around the rotational axis which is the X axis in FIG. 1. Therefore, the movable portion 120 substantially swings to rotate around the rotational axis which is the X axis in FIG. 1, due to the swing of the inner support body 210.

In addition, the Lorentz force caused by the electromagnetic interaction between the static magnetic field applied from a pair of permanent magnets 160 and the control current supplied to the driving coil 140 is transmitted to the movable portion 120 as a inertial force. As a result, the movable portion 120 swings to rotate around the rotational axis which is the Y axis in FIG. 1.

As described above, according to the actuator 1 in the first example, the movable portion 120 swings around two axes.

Incidentally, in the first example, the swing of the movable portion 120 around two axes is realized by swinging the inner support body 210 due to the Lorentz force itself and by swinging the movable portion 120 due to the Lorentz force used as the inertial force. However, the driving coil which is used to generate the Lorentz force for swinging the movable portion 120 may be formed on the movable portion 120. In this case, it is preferable that a wiring which connects the driving coil on the movable portion 120 and the supply terminals 170 on the outer support body 110 be formed on a pair of torsion bars 230 (furthermore, on the inner support body 210, a pair of torsion bars 130 and the outer support body 110).

Especially in the first example, as illustrated in FIG. 1 and FIG. 2, the movable portion 120 has one or more protruding portion(s) (four protruding portions in an example illustrated in FIG. 1 and FIGS. 2) 122. Moreover, as illustrated in FIG. 2, the rib 123 is formed to extend toward and on the protruding portions 122.

Hereinafter, with reference to FIG. 3, the protruding portions 122 which the movable portion 120 has and the rib 123 which extends on the protruding portions 122 will be explained. FIG. 3 are enlarged lower views illustrating one portion of the lower surface of the movable portion 120.

As illustrated in FIG. 3(a), each protruding portion 122 is an area portion which protrudes than a surrounding area portion which surrounds each protruding portion 122 (in other word, than an area portion which is adjacent to the protruding portion 122). More specifically, each protruding portion 122 protrudes in a direction along the lower surface of the movable portion 120 (namely, in a direction along a XY plane) and protrudes toward an outside of the movable portion 120. In other words, each protruding portion 122 protrudes in the direction along the lower surface of the movable portion 120 to draw away from the center of the movable portion 120 (for example, from a point at which the first rib portion 123-1 intersects with the second rib portion 123-2). In other words, each protruding portion 122 protrudes in the direction along the lower surface of the movable portion 120 and toward the outside of the movable portion 120 than a virtual outer edge (see a dashed line in FIG. 3(a)) of the movable portion 120 which is presumed in the case where each protruding portion 122 is not formed. Namely, one portion of the movable portion 120 protrudes in the direction along the lower surface of the movable portion 120 and toward the outside of the movable portion 120.

Incidentally, the shape of each protruding portion 122 illustrated in FIG. 3(a) is one example. Therefore, each protruding portion 122 may has any shape as long as each protruding portion 122 protrudes than the surrounding area portion (for example, protrudes than the virtual outer edge of the movable portion 120 which is presumed in the case where each protruding portion 122 is not formed).

It is preferable that the protruding portions 122 be unified (in other words, integrally formed from same component) with the movable portion 120. However, each protruding portion 122 may constructed to be added (in other words, coupled or attached) to the movable portion 120 subsequently. However, as described later in detail, the actuator 1 is often manufactured from a SOI (Silicon On Insulator) wafer. In this case, it is preferable that the movable portion 120 and the protruding portions 122 be integrally formed from a first silicon layer (in other words, a device layer or an active layer) or the like of the SOI wafer.

Moreover, it is preferable that the protruding portions 122 be located on a plane which is same as a plane at which the movable portion 120 is located. In other words, it is preferable that the lower surfaces of protruding portions 122 and the lower surface of the movable portion 120 are located at the same plane. However, the protruding portions 122 are not necessarily located on the plane which is same as the plane at which the movable portion 120 is located. Incidentally, if the actuator 1 is manufactured from the SOI wafer, the protruding portions 122 are located on the plane which is same as the plane at which the movable portion 120 is located, because the movable portion 120 and the protruding portions 122 are integrally formed from the first silicon layer or the like of the SOI wafer.

Moreover, it is preferable that a thickness of each protruding portion 122 be same as a thickness of the movable portion 120. However, the thickness of each protruding portion 122 are not necessarily same as the thickness of the movable portion 120. Incidentally, if the actuator 1 is manufactured from the SOI wafer, the thickness of each protruding portion 122 is same as the thickness of the movable portion 120, because the movable portion 120 and the protruding portions 122 are integrally formed from the first silicon layer or the like of the SOI wafer.

Incidentally, in an example illustrated in FIG. 3(a), each protruding portion 122 protrudes along the rotational axis (the Y axis in FIG. 3(a)) of the movable portion 120. This is for suppressing an increase of an inertial moment of the movable portion 120 around the rotational axis.

Moreover, it is preferable that a fillet process for rounding a corner (alternatively, a chamfering process, a curving process or a rounding process) be performed on a border between each protruding portion 122 and the surrounding area portion which surrounds each protruding portion 122. However, the fillet process for rounding the corner (alternatively, the chamfering process, the curving process or the rounding process) is not necessarily performed on the border between each protruding portion 122 and the surrounding area portion which surrounds each protruding portion 122.

As illustrated in FIG. 3(a), the rib 123 is formed to extend toward and on the protruding portions 122. In other words, the rib 123 is formed to extend continuously from an area portion other than the protruding portions 122 to the protruding portions 122. Namely, the rib 123 is formed to protrude with the protruding portions 122 in the direction along the lower surface of the movable portion 120 and toward the outside of the movable portion 120. In an example illustrated in FIG. 3(a), the rib 123 is formed such that the fourth rib portion 123-4 of the rib 123 extends toward and on the protruding portions 122.

It is preferable that an outer edge of the rib 123 at the rotational axis side (the torsion bar 230 side) be away from (separated from) an outer edge of each protruding portion 122 at the rotational axis side, on each protruding portion 122. Namely, the rib 123 is preferably formed such that an area portion of each protruding portion 122 on which the rib 123 is not formed and an area portion of each protruding portion 122 on which the rib 123 is formed are located on each protruding portion 122 in this order from the rotational axis of the movable portion 120 (in other words, from the torsion bar 230) along a direction which intersects with (typically, is perpendicular to) the rotational axis of the movable portion 120.

On the other hand, an outer edge of the rib 123 at an opposite side which is opposite to the rotational axis side is not necessarily away from an outer edge of each protruding portion 122 at the opposite side which is opposite to the rotational axis side. However, the outer edge of the rib 123 at the opposite side which is opposite to the rotational axis side may be away from the outer edge of each protruding portion 122 at the opposite side which is opposite to the rotational axis side.

Incidentally, it is preferable that the movable portion 120 have each protruding portion 122 near the connecting portion between the movable portion 120 and the torsion bar 230. In other words, it is preferable that the movable portion 120 have the above described protruding portions 122 in accordance with the extending manner of a rib portion of the rib 123 which is closer to (alternatively, closest to) the connecting portion between the movable portion 120 and the torsion bar 230. For example, in an example illustrated in FIG. 3, the fourth rib portion 123-4 among the four rib portions which the rib 123 is provided with is the one that is closer to (alternatively, closest to) the connecting portion between the movable portion 120 and the torsion bar 230. Therefore, in an example illustrated in FIG. 3, the movable portion 120 has the protruding portions 122 in accordance with the extending manner of the fourth rib portion 123-4. Specifically, the movable portion 120 has the protruding portions 122 which protrude toward a direction along which the fourth rib portion 123-4 extends.

Moreover, as illustrated in FIG. 3(b), the rib 123 may further protrudes in the direction along the lower surface of the movable portion 120 (namely, in the XY plane) and toward the outside of the movable portion 120 from the protruding portions 122. Namely, the rib 123 may has such a shape that one portion thereof protrudes from the protruding portions 122.

The above described actuator 1 in the first example is capable of relaxing the force which is applied to a base of the rib 123 (in other words, to a connecting portion between the rib 123 and the movable portion 120, to a connecting portion at which the rib 123 is connected to the movable portion 120) due to the swing of the movable portion 120, because the rib 123 extends toward and on the protruding portions 122. Especially, it is possible to relax the force which is applied to the base of the rib 123 near the connecting portion between the torsion bar 230 and the movable portion 120. In other words, it is possible to preventing the force from concentrating at the base of the rib 123 due to the swing of the movable portion 120.

Hereinafter, with reference to FIG. 4 and FIG. 5, the relaxing of the force which is applied to the base of the rib 123 will be explained. FIG. 4 is an enlarged lower view illustrating one portion of the lower surface of the movable portion 120. FIG. 5 is an enlarged lower view illustrating one portion of the lower surface of the movable portion 120 in an actuator of a comparison example which does not have the protruding portions 122.

Generally, when the movable portion 120 which is supported by a pair of the torsion bars 230 swings, the force tends to concentrate at an area portion at which a hardness of the torsion bar 230 or the movable portion 120 drastically changes. Here, the torsion bar 230 or the movable portion 120 tends to harden more, as a width of the torsion bar 230 or the movable portion 120 becomes larger.

Thus, as illustrated in FIG. 4, in the actuator 1 in the first example, the width of the torsion bar 230 or the movable portion 120 gradually becomes larger (see the width A and the width B in FIG. 4) and then the width of the movable portion 120 drastically becomes larger at a position where the protruding portion 122 exists (see the width C in FIG. 4), along a direction from the torsion bar 230 toward the movable portion 120. Namely, the width of the movable portion 120 drastically becomes larger at a border between the outer edge of each protruding portion 122 at the rotational axis side and the surrounding area portion which surrounds each protruding portion 122 (see the width C in FIG. 4). Therefore, the force caused by the swing of the movable portion 120 concentrates at a position where the width of the movable portion 120 drastically becomes larger (namely, at the border between the outer edge of each protruding portion 122 at the rotational axis side and the surrounding area portion, and see a circular sign in FIG. 4 which is represented by a dashed line). As a result, the force caused by the swing of the movable portion 120 does not concentrate at the rib 123 (alternatively, the base of the rib 123) formed at a position which is away from the border between the outer edge of each protruding portion 122 at the rotational axis side and the surrounding area portion. Namely, it is possible to relax the force which is applied to the rib 123 (alternatively, the base of the rib 123) formed at a position which is away from the border between the outer edge of each protruding portion 122 at the rotational axis side and the surrounding area portion.

Incidentally, as illustrated in FIG. 5 just for reference, in the actuator in the comparison example which does not have the protruding portions 122, the width of the torsion bar 230 or the movable portion 120 gradually becomes larger along a direction from the torsion bar 230 toward the movable portion 120. The width of the movable portion 120 also gradually becomes larger at an area portion where the rib 123 is formed. Therefore, in the actuator in the comparison example, the force which is applied to the rib 123 (alternatively, the connecting portion between the rib 123 and the movable portion 120 or the protruding portion 122) is not relaxed easily.

As described above, the actuator 1 in the first example is capable of relaxing the force which is applied to the base of the rib 123 due to the swing of the movable portion 120.

Incidentally, as illustrated in a left drawing in FIG. 6 just for reference, the rib 123 (for example, the rib 123 in a ring shape) may be formed at an area portion of the movable portion 120 which is far away from the connecting portion between the torsion bar 230 and the movable portion 120, if the relaxing of the force which is applied to the base of the rib 123 is prioritized. However, if the rib 123 is formed at an area portion of the movable portion 120 which is far away from the connecting portion between the torsion bar 230 and the movable portion 120, it is possibly difficult to maintain the flatness of the movable portion 120 as illustrated in a right drawing in FIG. 6. On the other hand, the actuator 1 in the first example has a very useful effect to relax the force which is applied to the connecting portion between the rib 123 and the movable portion 120 while maintaining the flatness of the movable portion 120.

Moreover, as described above, the actuator 1 in the first example is often manufactured from the SOI wafer. In this case, as illustrated in FIG. 7, the movable portion 120 and the torsion bars 230 are formed from the first silicon layer (in other words, the device layer or the active layer) 181 and the rib 123 is formed from a second silicon layer (in other words, a handle layer or a supporting layer) 183. Here, there is a box layer (in other words, a thermal oxide layer) 182 between the first silicon layer 181 and the second silicon layer 183. The box layer 182 is weaker than the first silicon layer 181 and the second silicon layer 183, and thus is destroyed by the force caused by the swing of the movable portion 120 more easily. The destruction of the box layer 182 possibly results in a detachment of the rib 123 from the movable portion 120. Furthermore, as illustrated in a right drawing in FIG. 7, a notch is possibly formed at the base of the rib 123 which is formed from the second silicon layer 183 (however, the actuator 1 is usually manufactured such that the notch is not formed at the base of the rib 123 which is formed from the second silicon layer 183, as illustrated in a center drawing in FIG. 7), due to a manufacturing process of the actuator 1. This notch possibly allows the force caused by the swing of the movable portion to detach the rib 123 from the movable portion 120. However, in the first example, since it is possible to relax the force which is applied to the base of the rib 123, the rib 123 is not detached from the movable portion 120 so easily, even if there is the box layer 182 between the first silicon layer 181 (the movable portion 120) and the second silicon layer 183 (the rib 123) and the notch is formed at the base of the rib 123, which is a very useful effect.

In the above described explanation, an example in which the protruding portions 122 protrude along the rotational axis (the Y axis in FIG. 3) of the movable portion 120 is used. However, as illustrated in FIG. 8(a), the protruding portions 122 may protrude to draw away from the rotational axis of the movable portion 120. Even in this case, it is possible to relax the force which is applied to the connecting portion between the rib 123 and the movable portion 120 due to the swing of the movable portion 120.

Alternatively, as illustrated in FIG. 8(b), the protruding portions 122 may protrude to come close to the rotational axis of the movable portion 120. Even in this case, it is possible to relax the force which is applied to the connecting portion between the rib 123 and the movable portion 120 due to the swing of the movable portion 120. Moreover, in this case, the rib 123 can be formed to be away from the connecting portion between the torsion bar 230 and the movable portion 120 as much as possible, compared to the case where the protruding portions 122 do not protrude to come close to the rotational axis of the movable portion 120. Thus, it is possible to relax the force which is applied to the connecting portion between the rib 123 and the movable portion 120 due to the swing of the movable portion 120.

(2) Second Example

Next, with reference to FIG. 9 and FIG. 10, an actuator 2 in a second example will be explained. FIG. 9 is a plan view illustrating one example of the structure of the actuator 2 in the second example which is viewed from an upper side. FIG. 10 is a plan view illustrating one example of the structure of the actuator 2 in the second example which is viewed from a lower side. Incidentally, in FIG. 9 and FIG. 10 (moreover, FIG. 11 to FIG. 13), the actuator 2 is explained by using a virtual three dimensional space which is defined by an X axis, a Y axis and a Z axis. Incidentally, the same component as that of the above described actuator 1 in the first example will carry the same reference number, and the detailed explanation thereof will be omitted.

As illustrated in FIG. 9 and FIG. 10, the actuator 2 in the second example is different from the actuator 1 in the first example in that one or more cut portion(s) 124 is (are) formed at the movable portion 120 instead of one or more protruding portion(s) 122 being formed. Moreover, the actuator 2 in the second example is different from the actuator 1 in the first example in that the rib 123 is formed to extend adjacently to the cut portions 124. Another feature of the actuator 2 in the second example may be same as another feature of the actuator 1 in the first example.

Hereinafter, with reference to FIG. 11, the cut portions 124 which is formed at the movable portion 120 and the rib 123 which extends adjacently to the cut portions 124 will be explained. FIG. 11 is an enlarged lower view illustrating one portion of the lower surface of the movable portion 120.

As illustrated in FIG. 11, each cut portion 124 is an area portion which is concaved from a surrounding area portion which surrounds each cut portion 124 (in other word, than an area portion which is adjacent to the cut portion 124). More specifically, each cut portion 124 extends in the direction along the lower surface of the movable portion 120 (namely, in the direction along the XY plane) and extends toward an inside of the movable portion 120. In other words, each cut portion 124 extends in the direction along the lower surface of the movable portion 120 to come close to the center of the movable portion 120 (for example, from the point at which the first rib portion 123-1 intersects with the second rib portion 123-2). In other words, each cut portion 124 extends in the direction along the lower surface of the movable portion 120 and toward the inside of the movable portion 120 than a virtual outer edge (see a dashed line in FIG. 11) of the movable portion 120 which is presumed in the case where each cut portion 124 is not formed. Namely, one portion of the movable portion 120 is concaved in the direction along the lower surface of the movable portion 120 and toward the inside of the movable portion 120.

Incidentally, the shape of each cut portion 124 illustrated in FIG. 11 is one example. Therefore, each cut portion 124 may has any shape as long as each cut portion 124 is concaved than the surrounding area portion (for example, is concaved than the virtual outer edge of the movable portion 120 which is presumed in the case where each cut portion 124 is not formed).

Moreover, it is preferable that each cut portion 124 penetrate a structure which constitutes the movable portion 120 (for example, the first silicon wafer of the SOI wafer, if the actuator 2 is manufactured from the SOI wafer) along the direction which intersects with (typically, is perpendicular to) the lower surface of the movable portion 120. Namely, it is preferable that the cut portion 124 is an area portion at which the structure which constitutes the movable portion 120 does not exist.

Incidentally, in an example illustrated in FIG. 11, each cut portion 124 extends along the rotational axis (the Y axis in FIG. 11) of the movable portion 120. This is for suppressing the increase of the inertial moment of the movable portion 120 around the rotational axis.

Moreover, it is preferable that the fillet process for rounding the corner (alternatively, the chamfering process, the curving process or the rounding process) be performed on at least one portion of an outer edge of the movable portion 120 which is defined by each cut portion 124 (in an example illustrated in FIG. 11, at least one portion of an outer edge of the movable portion 120 which is defined by a top of each cut portion 124). However, the fillet process for rounding the corner (alternatively, the chamfering process, the curving process or the rounding process) is not necessarily performed on at least one portion of the outer edge of the movable portion 120 which is defined by each cut portion 124

As illustrated in FIG. 11, the rib 123 is formed to extend adjacently to each cut portion 124. In other words, the rib 123 is formed to extend continuously from an area portion which is not adjacent to each cut portion 124 to an area portion which is adjacent to each cut portion 124. In an example illustrated in FIG. 11, the rib 123 is formed such that the fourth rib portion 123-4 of the rib 123 extends adjacently to each cut portion 124.

The rib 123 is formed such that each cut portion 124 is located between the rotational axis of the movable portion 120 and the rib 123 along the direction which intersects with (typically, is perpendicular to) the rotational axis (the Y axis in FIG. 11) of the movable portion 120. In other words, the rib 123 is formed such that a distance between the rib 123 and the rotational axis of the movable portion 120 (especially, a distance along the direction which intersects with (typically, is perpendicular to) the rotational axis of the movable portion 120) is larger than a distance between the cut portion 124 and the rotational axis of the movable portion 120.

Incidentally, the area portion on which the rib 123 is formed can be substantially treated as a protruding portion which protrudes than the cut portion 124, if the cut portion 124 is focused. Therefore, even in the second example, it can be said that the rib 123 is formed to protrude in the direction along the lower surface of the movable portion 120 and toward the outside of the movable portion 120, as with the first example.

Moreover, it is preferable that the outer edge of the rib 123 at the rotational axis side (the torsion bar 230 side) be away from (separated from) an outer edge of each cut portion 124 at an opposite side which is opposite to the rotational axis side. Namely, the rib 123 is preferably formed such that the cut portion 124, an area portion of the movable portion 120 on which the rib 123 is not formed and an area portion of the movable portion 120 on which the rib 123 is formed are located in this order from the rotational axis of the movable portion 120 (in other words, from the torsion bar 230) along the direction which intersects with (typically, is perpendicular to) the rotational axis of the movable portion 120.

Incidentally, it is preferable that each cut portion 124 be formed at the movable portion 120 near the connecting portion between the movable portion 120 and the torsion bar 230. In other words, it is preferable that the above described cut portions 124 be formed at the movable portion 120 in accordance with the extending manner of a rib portion of the rib 123 which is closer to (alternatively, closest to) the connecting portion between the movable portion 120 and the torsion bar 230. For example, in an example illustrated in FIG. 11, the fourth rib portion 123-4 among the four rib portions which the rib 123 is provided with is the one that is closer to (alternatively, closest to) the connecting portion between the movable portion 120 and the torsion bar 230. Therefore, in an example illustrated in FIG. 11, the cut portions 124 is formed at the movable portion 120 in accordance with the extending manner of the fourth rib portion 123-4. Specifically, the cut portions 124 which extend toward the direction along which the fourth rib portion 123-4 extends are formed at the movable portion 120.

Incidentally, even in the second example, the rib 123 may further protrudes in the direction along the lower surface of the movable portion 120 (namely, in the XY plane) and toward the outside of the movable portion 120 from the movable portion 120. Namely, the rib 123 may has such a shape that one portion thereof protrudes from the movable portion 120.

The above described actuator 2 in the second example is capable of enjoying the effect which is same as the effect that the actuator 1 in the first example can enjoy. Namely, it is possible to relax the force which is applied to the base of the rib 123 due to the swing of the movable portion 120. In other words, it is possible to prevent the force from concentrating at the base of the rib 123 due to the swing of the movable portion 120.

Hereinafter, with reference to FIG. 12, the relaxing of the force which is applied to the base of the rib 123 will be explained. FIG. 12 is an enlarged lower view illustrating one portion of the lower surface of the movable portion 120.

As described above, when the movable portion 120 which is supported by a pair of the torsion bars 230 swings, the force tends to concentrate at an area portion at which a hardness of the torsion bar 230 or the movable portion 120 drastically changes. Here, the torsion bar 230 or the movable portion 120 tends to harden more, as a width of the torsion bar 230 or the movable portion 120 becomes larger.

Thus, as illustrated in FIG. 12, in the actuator 2 in the second example, the width of the torsion bar 230 or the movable portion 120 gradually becomes larger (see the width A and the width B in FIG. 12) and then the width of the movable portion 120 drastically becomes larger at a position where the cut portion 124 starts not to exist (see the width C in FIG. 12), along a direction from the torsion bar 230 toward the movable portion 120. Namely, the width of the movable portion 120 becomes larger drastically at the top of each cut portion 124 (see the width C in FIG. 12). Therefore, the force caused by the swing of the movable portion 120 concentrates at a position where the width of the movable portion 120 becomes larger drastically (namely, at the top of each cut portion 124, and see a circular sign in FIG. 12 which is represented by a dashed line). As a result, the force caused by the swing of the movable portion 120 does not concentrate at the rib 123 (alternatively, the base of the rib 123) formed at a position which is away from the top of each cut portion 124. Namely, it is possible to relax the force which is applied to the rib 123 (alternatively, the base of the rib 123) formed at a position which is away from the top of each cut portion 124.

Incidentally, as described above, the area portion on which the rib 123 (especially, the fourth rib portion 123-4) is formed can be substantially treated as the protruding portion which protrudes than the cut portion 124, if the cut portion 124 is focused. Therefore, the reason why the actuator 2 in the second example relaxes the force which is applied to the base of the rib 123 is same as the reason why the actuator 1 in the first example relaxes the force which is applied to the base of the rib 123.

In the above described explanation, an example in which the cut portions 124 extends along the rotational axis (the Y axis in FIG. 11) of the movable portion 120 is used. However, as illustrated in FIG. 13(a), the cut portion 124s may extend to come close to the rotational axis of the movable portion 120. Even in this case, it is possible to relax the force which is applied to the connecting portion between the rib 123 and the movable portion 120 due to the swing of the movable portion 120.

Alternatively, as illustrated in FIG. 13(b), the cut portions 124 may extend to draw away from the rotational axis of the movable portion 120. Even in this case, it is possible to relax the force which is applied to the connecting portion between the rib 123 and the movable portion 120 due to the swing of the movable portion 120. Moreover, in this case, the rib 123 can be formed to be away from the connecting portion between the torsion bar 230 and the movable portion 120 as much as possible, compared to the case where the cut portions 124 do not extend to draw away from the rotational axis of the movable portion 120. Thus, it is possible to relax the force which is applied to the connecting portion between the rib 123 and the movable portion 120 due to the swing of the movable portion 120.

(3) Third Example

Next, with reference to FIG. 14, an actuator 3 in a third example will be explained. FIG. 14 is an enlarged lower view illustrating one portion of a lower surface of the movable portion 120 which the actuator 3 in the third example is provided with. Incidentally, the same component as that of the above described actuator 1 in the first example or the above described actuator 2 in the second example will carry the same reference number, and the detailed explanation thereof will be omitted.

As illustrated in FIG. 14, the actuator 3 in the third example is different from the actuator 1 in the first example in that one or more cut portion(s) 124 is (are) formed at the movable portion 120 in addition to one or more protruding portion(s) 122 being formed. In other words, the actuator 3 in the third example is different from the actuator 2 in the second example in that one or more protruding portion(s) 122 is (are) formed at the movable portion 120 in addition to one or more cut portion(s) 124 being formed.

The actuator 3 in the three example is capable of enjoying the effect which is same as the effect that the actuator 1 in the first example and the actuator 2 in the second example can enjoy. Namely, it is possible to relax the force which is applied to the base of the rib 123 due to the swing of the movable portion 120. In other words, it is possible to prevent the force from concentrating at the base of the rib 123 due to the swing of the movable portion 120.

(4) Fourth Example

Next, with reference to FIG. 15 and FIG. 16, an actuator 4 in a fourth example will be explained. FIG. 15 is a plan view illustrating one example of the structure of the actuator 4 in the fourth example which is viewed from an upper side. FIG. 16 is a plan view illustrating one example of the structure of the actuator 4 in the fourth example which is viewed from a lower side. Incidentally, in FIG. 15 and FIG. 16, the actuator 4 is explained by using a virtual three dimensional space which is defined by an X axis, a Y axis and a Z axis. Incidentally, the same component as that of the above described actuator 1 in the first example will carry the same reference number, and the detailed explanation thereof will be omitted.

As illustrated in FIG. 15 and FIG. 16, the actuator 4 in the fourth example is different from the actuator 1 in the first example in that the movable portion 120 swings around single axis. Specifically, the actuator 4 is provided with: the outer support body 110, a pair of torsion bars 230, the movable portion 120, the driving coil 140, a pair of permanent magnets 160 and a pair of supply terminals 170. Moreover, as illustrated in FIG. 15, the mirror 121 is formed on the upper surface (for example, the front surface) of the movable portion 120. Moreover, as illustrated in FIG. 15 and FIG. 16, the movable portion 120 has one or more protruding portion(s) (four protruding portions in an example illustrated in FIG. 15 and FIG. 16) 122. Moreover, as illustrated in FIG. 16, the rib 123 is formed on the lower surface (for example, the back surface) of the movable portion 120 to extend toward and on the protruding portions 122. Namely, the actuator 4 in the fourth example is different from the actuator 1 in the first example in that it does not have a pair of torsion bars 130 and the inner support body 210.

When the above described actuator 4 in the fourth example operates (specifically, when the movable portion 120 swings), firstly, the control current is supplied to the driving coil 140 via the supply terminals 170 and the wiring 150. In this case, the control current which is supplied to the driving coil 140 is preferably a current including the signal for swinging the movable portion 120 (specifically, the signal which is synchronized with the cycle of the swing of the movable portion 120). On the other hand, the static magnetic field is applied to the driving coil 140 by a pair of permanent magnets 160. Therefore, the force (namely, Lorentz force) is generated in the driving coil 140 due to the electromagnetic interaction between the static magnetic field applied from a pair of permanent magnets 160 and the control current supplied to the driving coil 140. As a result, the movable portion 120 on which the driving coil 140 is formed swings by the Lorentz force caused by the electromagnetic interaction between the static magnetic field applied from a pair of permanent magnet 160 and the control current supplied to the driving coil 140. Namely, the movable portion 120 swings to rotate around the rotational axis which is the X axis in FIG. 15 and FIG. 16.

As described above, according to the actuator 4 in the fourth example, the movable portion 120 swings around single axis. Even the actuator 4 by which the movable portion 120 swings around single axis is capable of enjoying the effect which is same as the effect that the actuator 1 in the first example can enjoy, because the movable portion 120 has the protruding portions 122 and the rib 123 is formed to extend on the protruding portions 122.

Incidentally, even in the actuator 4 in the fourth example, one or more cut portion(s) 124 may be formed at the movable portion 120 instead of one or more protruding portion(s) 122 being formed. Alternatively, even in the actuator 4 in the fourth example, one or more cut portion(s) 124 may be formed at the movable portion 120 in addition to one or more protruding portion(s) 122 being formed.

Incidentally, one portion of the components which are explained in the first example to the fourth example can be combined as occasion demand. Even in this case, the actuator, which is obtained by combining one portion of the components which are explained in the first example to the fourth example, is capable of enjoying the above described various effects.

In the present invention, various changes may be made, if desired, without departing from the essence or spirit of the invention which can be read from the claims and the entire specification. An actuator, which involves such changes, is also intended to be within the technical scope of the present invention.

DESCRIPTION OF REFERENCE CODES

110 outer support body
210 inner support body
120 movable portion
121 mirror
122 protruding portion
123 rib
124 cut portion
130 torsion bar
230 torsion bar
140 driving coil
150 wiring
160 permanent magnet

The invention claimed is:
1. An actuator comprising:
a planar movable portion;
a supporting portion which supports the movable portion; and
a torsion bar which connects the movable portion and the supporting portion along a longitudinal direction thereof such that the movable portion swings around a rotational axis which is along the longitudinal direction,
a rib being formed on a surface of the movable portion, the rib maintaining a flatness of the movable portion,
the movable portion having a protruding portion near a connecting portion between the torsion bar and the movable portion, the protruding portion protruding in a direction along the surface and protruding toward an outside of the movable portion than a surrounding area portion,
at least one portion of the rib being formed on the surface to extend on the protruding portion.

2. The actuator according to claim 1, wherein
the movable portion has the protruding portion at a position corresponding to the rib which is formed to be closest to the connecting portion between the torsion bar and the movable portion.
3. The actuator according to claim 1, wherein
the protruding portion protrudes to draw away from the rotational axis.
4. The actuator according to claim 1, wherein
the protruding portion protrudes along the rotational axis.
5. The actuator according to claim 1, wherein
the protruding portion protrudes to come close to the rotational axis.
6. The actuator according to claim 1, wherein
an outer edge of the rib at the rotational axis side is located at a position which shifts from an outer edge of the protruding portion at the rotational axis side to draw away from the rotational axis.
7. The actuator according to claim 1, wherein
a border portion between the protruding portion and the surrounding area portion is chamfered, curved or rounded or has a fillet geometry.
8. The actuator according to claim 1, wherein
a cut portion is formed at the movable portion, the cut portion extends in the direction along the surface and extends toward an inside of the movable portion than a surrounding area portion,
at least one portion of the rib is formed on the surface to extend adjacently to the cut portion such that the cut portion is located between the rib and the rotational axis.
9. An actuator comprising:
a planar movable portion;
a supporting portion which supports the movable portion; and
a torsion bar which connects the movable portion and the supporting portion along a longitudinal direction thereof such that the movable portion swings around a rotational axis which is along the longitudinal direction,
a rib being formed on a surface of the movable portion, the rib maintaining a flatness of the movable portion,
a cut portion being formed at the movable portion, the cut portion extending in the direction along the surface and extending toward an inside of the movable portion than a surrounding area portion,
at least one portion of the rib being formed on the surface to extend adjacently to the cut portion such that the cut portion is located between the rib and the rotational axis.
10. The actuator according to claim 9, wherein
the cut portion is formed at a position of the movable portion corresponding to the rib which is formed to be closest to the connecting portion between the torsion bar and the movable portion.
11. The actuator according to claim 9, wherein
the cut portion extends to come close to the rotational axis.
12. The actuator according to claim 9, wherein
the cut portion extends along the rotational axis.
13. The actuator according to claim 9, wherein
the cut portion extends to draw away from the rotational axis.
14. The actuator according to claim 9, wherein
an outer edge of the rib at the rotational axis side is located at a position which shifts from an outer edge of the cut portion at a side opposite to the rotational axis side to draw away from the rotational axis.

15. The actuator according to claim 9, wherein
an outer edge of the movable portion which is defined by the cut portion is chamfered, curved or rounded or has a fillet geometry.
16. The actuator according to claim 9, wherein
the movable portion has a protruding portion near a connecting portion between the torsion bar and the movable portion, the protruding portion protrudes in a direction along the surface and protrudes toward an outside of the movable portion than a surrounding area portion,
at least one portion of the rib is formed on the surface to extend on the protruding portion.

\* \* \* \* \*